US007839075B2

(12) United States Patent
Suzuri et al.

(10) Patent No.: US 7,839,075 B2
(45) Date of Patent: Nov. 23, 2010

(54) ORGANIC ELECTROLUMINESCENT ELEMENT, ILLUMINATOR AND DISPLAY

(75) Inventors: Yoshiyuki Suzuri, Musashino (JP); Hiroshi Kita, Hachioji (JP); Aki Nakata, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 345 days.

(21) Appl. No.: 10/565,043

(22) PCT Filed: Jul. 8, 2004

(86) PCT No.: PCT/JP2004/010082

§ 371 (c)(1),
(2), (4) Date: Jan. 18, 2006

(87) PCT Pub. No.: WO2005/009088

PCT Pub. Date: Jan. 27, 2005

(65) Prior Publication Data

US 2006/0175957 A1    Aug. 10, 2006

(30) Foreign Application Priority Data

Jul. 23, 2003    (JP) .............................. 2003-200425

(51) Int. Cl.
*H01L 51/52*    (2006.01)
(52) U.S. Cl. ........................................ 313/504; 438/37
(58) Field of Classification Search ......... 313/498–512; 315/169.1, 169.3; 428/690–691, 917; 438/26–29, 438/34, 82; 257/40, 72, 98–100, 642–643, 257/759; 427/66, 532–535, 539; 445/24–25
See application file for complete search history.

(56) References Cited

U.S. PATENT DOCUMENTS 6,541,909 B1 *   4/2003   Motomatsu ................. 313/504
6,580,213 B2 *   6/2003   Yamazaki ................... 313/506

(Continued)

FOREIGN PATENT DOCUMENTS

JP          63-264692         11/1988

(Continued)

OTHER PUBLICATIONS

Zhou X et al: "High-efficiency electrophosphorescent organic light-emitting diodes with double light-emitting layers", Applied Physics Letters, AIP, American Institute of Physics, Melville, NY, vol. 81, No. 21, Nov. 18, 2002, pp. 4070-4072, XP012032604.

(Continued)

*Primary Examiner*—Nimeshkumar D Patel
*Assistant Examiner*—Donald L Raleigh
(74) *Attorney, Agent, or Firm*—Holtz, Holtz, Goodman & Chick, P.C.

(57) ABSTRACT

An organic electroluminescent element containing an anode and a cathode having therebetween a light emitting layer containing a phosphorescent compound, and hole blocking layer 1 provided adjacent to the light emitting layer and between the light emitting layer and the cathode, wherein hole blocking layer 1 contains a phosphorescent compound; and a content of the phosphorescent compound contained in hole blocking layer 1 is in the range of 0.1 to 50% of a content of the phosphorescent compound contained in the light emitting layer.

27 Claims, 4 Drawing Sheets

U.S. PATENT DOCUMENTS

| | | |
|---|---|---|
| 6,803,720 B2 | 10/2004 | Kwung et al. |
| 6,951,694 B2* | 10/2005 | Thompson et al. .......... 428/690 |
| 2002/0182441 A1* | 12/2002 | Lamansky et al. .......... 428/690 |
| 2002/0197554 A1* | 12/2002 | Wolk et al. .................. 430/200 |
| 2003/0059647 A1* | 3/2003 | Thompson et al. .......... 428/690 |
| 2003/0068528 A1* | 4/2003 | Thompson et al. .......... 428/690 |
| 2003/0124381 A1* | 7/2003 | Thompson et al. .......... 428/690 |
| 2003/0143427 A1* | 7/2003 | Matsuo et al. .............. 428/690 |
| 2004/0043251 A1* | 3/2004 | Epstein et al. .............. 428/690 |
| 2005/0170621 A1* | 8/2005 | Kim et al. ................... 438/584 |

FOREIGN PATENT DOCUMENTS

| | | |
|---|---|---|
| JP | 03-255190 | 11/1991 |
| JP | 2000-021572 | 1/2000 |
| JP | 3093796 | 10/2000 |
| WO | WO 02/47457 A | 6/2002 |
| WO | WO 02/071813 A | 9/2002 |

OTHER PUBLICATIONS

Chwang Anna B et al: "Graded mixed-layer organic light-emitting devices", Applied Physics Letters, AIP, American Institute of Physics, Melville, NY, vol. 80, No. 5, Feb. 4, 2002, pp. 725-727, XP012031431.

G. Sakamoto, C. Adachi, T. Koyama, Y. Taniguchi, C. D. Merritt, H. Murata, Z. H. Kafafi: "Significant improvement of device durability in organic light-emitting diodes by doping both hole transport and emitting layers with rubrene molecules", Applied Physics Letters, vol. 75, No. 6, Aug. 9, 1999, pp. 766-768, XP002485774.

Z. D. Popovic, S. Xie, N. Hu, A. Hor, D. Fork, G. Anderson, C. Tripp: "Life extension of organic LED's by doping of a hole transport layer" Thin Solid Film, Vo. 363, 2000, pp. 6-8, XP002485773.

M. A. Baldo et al, Nature, 395, 151-154 (1998).

M. A. Baldo et al, Nature, 403 (17), 750-753 (2000).

* cited by examiner

ORGANIC ELECTROLUMINESCENT ELEMENT, ILLUMINATOR AND DISPLAY

This application is the United States national phase application of International Application PCT/JP2004/010082 filed Jul. 8, 2004.

TECHNICAL FIELD

The present invention relates to an organic electroluminescent element, an illuminator and a display, and, in detail, relates to an organic electroluminescent element, an illuminator and a display, exhibiting long life.

BACKGROUND

As an emission type electronic displaying device, an electroluminescent display (ELD) is known. Elements constituting the ELD include an inorganic electroluminescent element and an organic electroluminescent element (hereinafter also referred to as an organic EL element). Inorganic electroluminescent elements have been used for a plane light source, however, a high voltage alternating current has been required to drive the element.

An organic EL element has a structure in which a light emitting layer containing a light emitting compound is arranged between a cathode and an anode, and an electron and an electron hole are injected into the light emitting layer and recombined to form an exciton. The element emits light, utilizing light (fluorescent light or phosphorescent light) generated by inactivation of the exciton, and the element can emit light by applying a relatively low voltage of several volts to several tens of volts. The element exhibits a wide viewing angle and a high visuality since the element is self-luminous. Further, the element is a thin, completely solid element, and therefore, the element is noted from the viewpoint of space saving and portability.

A practical organic EL element is required to emit light of high luminance with high efficiency at a lower power. For example, disclosed are: an element exhibiting higher luminance of emitting light with longer life in which stilbene derivatives, distyrylarylene derivatives or tristyrylarylene derivatives doped with a slight amount of a fluorescent compound are employed (for example, see Patent Document 1); an element which has an organic light emitting layer containing an 8-hydroxyquinoline aluminum complex as a host compound doped with a slight amount of a fluorescent compound (for example, see Patent Document 2); and an element which has an organic light emitting layer containing an 8-hydroxyquinoline aluminum complex as a host compound doped with a quinacridone type dye (for example, see Patent Document 3).

When light emitted through excited singlet state is used in the organic EL elements disclosed in the above Patent Documents, the upper limit of the external quantum efficiency (ηext) is considered to be at most 5%, because the generation probability of excited species capable of emitting light is 25%, since the generation ratio of singlet excited species to triplet excited species is 1:3, and further, external light emission efficiency is 20%.

Since an organic EL element, employing phosphorescence through the excited triplet, was reported by Princeton University (for example, see Non-Patent Document 1), studies on materials emitting phosphorescence at room temperature have been actively carried out (for example, see Non-Patent Document 2 and Patent Document 4). As the upper limit of the internal quantum efficiency of the excited triplet is 100%, the light emission efficiency of the exited triplet is theoretically four times that of the excited singlet. Accordingly, light emission employing the excited triplet exhibits almost the same performance as a cold cathode tube, and can be applied to illumination.

In "The 10th International Workshop on Inorganic and Organic Electroluminescence (EL '00, Hamamatsu)", papers on phosphorescent compounds have been reported. For example, Ikai et al. have reported a phosphorescent compound in which a hole transporting material had been used as a host material. M. E. Thompson et al. have reported a phosphorescent compound of which the host material has been doped with a novel iridium complex compound. Tsutsui et al. have reported an organic EL element exhibiting high luminance by employing a hole blocking layer (an exciton blocking layer). Other examples of a hole blocking layer include: a kind of an aluminum complex reported by Pioneer Corp., and a fluorine substituted compound as a hole blocking layer (an exciton blocking layer) exhibiting high luminance, reported by Ikai et al. in Appl. Phys. Lett., 70, 156 (2001).

Patent Document 1: Japanese Pat. No. 3093796
Patent Document 2: Japanese Patent Publication Open to Public Inspection (hereafter referred to as JP-A) No. 63-264692
Patent Document 3: JP-A No. 3-255190
Patent Document 4: JP-A No. 2000-21572
Non-Patent Document 1: M. A. Baldo et al., Nature, 395, 151-154 (1998)
Non-Patent Document 2: M. A. Baldo et al., Nature, 403 (17), 750-753 (2000)

However, in general, a phosphorescent element tends to exhibit a shorter life time compared to a fluorescent element, and an organic EL element employing a phosphorescent compound as an emitting material is not fully durable when it is continuously driven.

This may be due to the deterioration of a blocking layer provided to attain high luminance and a high emission efficiency.

Namely, electrons or holes drifted from the light emitting layer cannot be fully blocked by the blocking layer and some of the electrons or holes migrate into the blocking layer, whereby the blocking layer is deteriorated and the life of the element is shortened. Further, the excitation life of a phosphorescent emission dopant is rather long, accordingly, when the concentration of excitons is high, a triplet exciton collides with another triplet exciton in the vicinity to cause T-T annihilation, whereby the emission efficiency is reduced.

The present invention was achieved under the above situations. An object of the present invention is to provide an organic electroluminescent element exhibiting long life and a high emission efficiency and, and to also provide an illumination and a display employing the organic electroluminescent element.

SUMMARY OF THE INVENTION

The above object of the present invention is achieved by the following structures.

(1) An organic electroluminescent element comprising an anode and a cathode having therebetween a light emitting layer containing a phosphorescent compound, and hole blocking layer 1 provided adjacent to the light emitting layer and between the light emitting layer and the cathode, wherein
hole blocking layer 1 contains a phosphorescent compound; and a content of the phosphorescent compound contained in hole blocking layer 1 is in the range of 0.1 to 50% of a content of the phosphorescent compound contained in the light emitting layer.

(2). The organic electroluminescent element of Item (1), wherein the organic electroluminescent element further contains hole blocking layer 2 provided adjacent to hole blocking layer 1 and between hole blocking layer 1 and the cathode.

(3) The organic electroluminescent element of Item (1) or Item (2), wherein the phosphorescent compound contained in the light emitting layer is the same as the phosphorescent compound contained in hole blocking layer 1.

(4) The organic electroluminescent element of Item (1) or Item (2), wherein the phosphorescent compound contained in the light emitting layer is different from the phosphorescent compound contained in hole blocking layer 1.

(5) An organic electroluminescent element comprising an anode and a cathode having therebetween a light emitting layer containing a phosphorescent compound, and electron blocking layer 1 provided adjacent to the light emitting layer and between the light emitting layer and the anode, wherein
    electron blocking layer 1 contains a phosphorescent compound; and
a content of the phosphorescent compound contained in electron blocking layer 1 is in the range of 0.1 to 50% of a content of the phosphorescent compound contained in the light emitting layer.

(6) The organic electroluminescent element of Item (5), wherein the organic electroluminescent element further contains electron blocking layer 2 provided adjacent to electron blocking layer 1 and between electron blocking layer 1 and the anode.

(7) The organic electroluminescent element of Item (5) or Item (6), wherein the phosphorescent compound contained in the light emitting layer is the same as the phosphorescent compound contained in electron blocking layer 1.

(8) The organic electroluminescent element of Item (5) or Item (6), wherein the phosphorescent compound contained in the light emitting layer is different from the phosphorescent compound contained in electron blocking layer 1.

(9) An organic electroluminescent element comprising an anode and a cathode having therebetween a light emitting layer containing a phosphorescent compound; hole blocking layer 1 provided adjacent to the light emitting layer and between the light emitting layer and the cathode; and electron blocking layer 1 provided adjacent to the light emitting layer and between the light emitting layer and the anode, wherein
    hole blocking layer 1 contains a phosphorescent compound;
    a content of the phosphorescent compound contained in hole blocking layer 1 is in the range of 0.1 to 50% of a content of the phosphorescent compound contained in the light emitting layer;
    electron blocking layer 1 contains a phosphorescent compound; and
    a content of the phosphorescent compound contained in electron blocking layer 1 is in the range of 0.1 to 50% of a content of the phosphorescent compound contained in the light emitting layer.

(10) The organic electroluminescent element of Item (9), wherein the organic electroluminescent element further contains hole blocking layer 2 provided adjacent to hole blocking layer 1 and between hole blocking layer 1 and the cathode.

(11) The organic electroluminescent element of Item (9) or Item (10), wherein the organic electroluminescent element further contains electron blocking layer 2 provided adjacent to electron blocking layer 1 and between electron blocking layer 1 and the anode.

(12) The organic electroluminescent element of any one of Items (9)-(11), wherein the phosphorescent compound contained in the light emitting layer is the same as the phosphorescent compound contained in hole blocking layer 1.

(13) The organic electroluminescent element of any one of Items (9)-(11), wherein the phosphorescent compound contained in the light emitting layer is different from the phosphorescent compound contained in hole blocking layer 1.

(14) The organic electroluminescent element of any one of Items (9)-(12), wherein the phosphorescent compound contained in the light emitting layer is the same as the phosphorescent compound contained in electron blocking layer 1.

(15) The organic electroluminescent element of any one of Items (9)-(11), wherein the phosphorescent compound contained in the light emitting layer is different from the phosphorescent compound contained in electron blocking layer 1.

(16) An organic electroluminescent element comprising an anode and a cathode having therebetween a light emitting layer containing a phosphorescent compound, and hole blocking layer 1 provided adjacent to the light emitting layer and between the light emitting layer and the cathode, wherein hole blocking layer 1 contains a phosphorescent compound so that an amount of light emitted from hole blocking layer 1 is in the range of 0.1 to 50% of an amount of light emitted from the light emitting layer.

(17) The organic electroluminescent element of Item (16), wherein the organic electroluminescent element further contains hole blocking layer 2 provided adjacent to hole blocking layer 1 and between hole blocking layer 1 and the cathode.

(18) An organic electroluminescent element comprising an anode and a cathode having therebetween a light emitting layer containing a phosphorescent compound, and electron blocking layer 1 provided adjacent to the light emitting layer and between the light emitting layer and the anode, wherein electron blocking layer 1 contains a phosphorescent compound so that an amount of light emitted from electron blocking layer 1 is in the range of 0.1 to 50% of an amount of light emitted from the light emitting layer.

(19) The organic electroluminescent element of Item (18), wherein the organic electroluminescent element further contains electron blocking layer 2 provided adjacent to electron blocking layer 1 and between electron blocking layer 1 and the anode.

(20) An organic electroluminescent element comprising an anode and a cathode having therebetween a light emitting layer containing a phosphorescent compound; hole blocking layer 1 provided adjacent to the light emitting layer and between the light emitting layer and the cathode; and electron blocking layer 1 provided adjacent to the light emitting layer and between the light emitting layer and the anode, wherein
    hole blocking layer 1 contains a phosphorescent compound so that an amount of light emitted from hole blocking layer 1 is in the range of 0.1 to 50% of an amount of light emitted from the light emitting layer; and electron blocking layer 1 contains a phosphorescent compound so that an amount of light emitted from electron blocking layer 1 is in the range of 0.1 to 50% of an amount of light emitted from the light emitting layer.

(21) The organic electroluminescent element of Item (20), wherein the organic electroluminescent element further contains hole blocking layer 2 provided adjacent to hole blocking layer 1 and between hole blocking layer 1 and the cathode.

(22) The organic electroluminescent element of Item (20) or Item (21), wherein the organic electroluminescent element further contains electron blocking layer 2 provided adjacent to electron blocking layer 1 and between electron blocking layer 1 and the anode.

(23) The organic electroluminescent element of any one of Items (1)-(22) emitting white light.

(24) A display containing the organic electroluminescent element of any one of Items (1)-(23).

(25) An illumination device containing the organic electroluminescent element of any one of Items (1)-(23).

(26) A display containing a liquid crystal cell and the illumination device of Item (25).

BEST MODE TO CARRY OUT THE INVENTION

Figure 1:
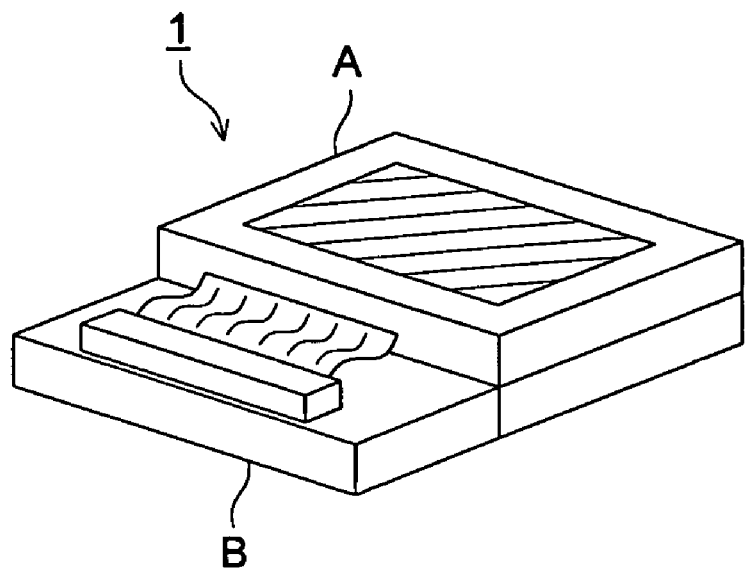
FIG. 1 is a schematic drawing of one example of a display containing an organic EL element.

The present invention will now be detailed.

The inventors of the present invention, as a result of the examination, have found that an organic electroluminescent (EL) element exhibiting long life and a high emission efficiency is obtained by an organic electroluminescent element containing an anode and a cathode having therebetween a light emitting layer containing a phosphorescent compound, and hole (electron hole) blocking layer 1 provided adjacent to the light emitting layer and between the light emitting layer and the cathode, wherein hole blocking layer 1 contains a phosphorescent compound; and the content of the phosphorescent compound contained in hole blocking layer 1 is in the range of 0.1 to 50% of the content of the phosphorescent compound contained in the light emitting layer.

Namely, the present inventors have found that, by controlling the content of the phosphorescent compound contained in hole blocking layer 1 in the range of 0.1-50% of the content of the phosphorescent compound contained in the light emitting layer, the holes migrated into hole blocking layer 1 are stabilized, whereby deterioration of hole blocking layer 1 is suppressed, and an elongation of the life of the organic EL element is attained. Also found has been that, by enlarging the recombination area, the concentration of the triplet exciton is reduced and the occurrence of T-T annihilation is suppressed, whereby the emission efficiency is increased.

The present inventors have found that an organic electroluminescent element exhibiting long life and a high emission efficiency is obtained by an organic electroluminescent element containing an anode and a cathode having therebetween a light emitting layer containing a phosphorescent compound, and electron blocking layer 1 provided adjacent to the light emitting layer and between the light emitting layer and the anode, wherein electron blocking layer 1 contains a phosphorescent compound; and a content of the phosphorescent compound contained in electron blocking layer 1 is in the range of 0.1 to 50% of a content of the phosphorescent compound contained in the light emitting layer.

Namely, the present inventors have found that, by controlling the content of the phosphorescent compound contained in electron blocking layer 1 in the range of 0.1-50% of the content of the phosphorescent compound contained in the light emitting layer, the electrons migrated into electron blocking layer 1 is stabilized, whereby deterioration of electron blocking layer 1 is suppressed, and that an elongation of the life of the organic EL element is attained. Also found has been that, by enlarging the recombination region, the concentration of the triplet exciton is reduced and the occurrence of T-T annihilation is suppressed, whereby the emission efficiency is increased.

Further, the present inventors have found that an organic electroluminescent element exhibiting longer life and a higher emission efficiency is obtained by an organic electroluminescent element comprising an anode and a cathode having therebetween a light emitting layer containing a phosphorescent compound; hole blocking layer 1 provided adjacent to the light emitting layer and between the light emitting layer and the cathode; and electron blocking layer 1 provided adjacent to the light emitting layer and between the light emitting layer and the anode, wherein hole blocking layer 1 contains a phosphorescent compound; the content of the phosphorescent compound contained in hole blocking layer 1 is in the range of 0.1 to 50% of the content of the phosphorescent compound contained in the light emitting layer; electron blocking layer 1 contains a phosphorescent compound; and the content of the phosphorescent compound contained in electron blocking layer 1 is in the range of 0.1 to 50% of the content of the phosphorescent compound contained in the light emitting layer.

The content of the phosphorescent compound contained in hole blocking layer 1 is preferably in the range of 1 to 20% of the content of the phosphorescent compound contained in the light emitting layer, whereby an organic electroluminescent element exhibiting longer life and a higher emission efficiency is obtained. The content of the phosphorescent compound contained in electron blocking layer 1 is preferably in the range of 1 to 20% of the content of the phosphorescent compound contained in the light emitting layer, whereby an organic electroluminescent element exhibiting longer life and a higher emission efficiency is obtained.

In the present invention, the organic electroluminescent element preferably contains hole blocking layer 2 provided adjacent to hole blocking layer 1 and between hole blocking layer 1 and the cathode, whereby an organic electroluminescent element exhibiting longer life and a higher emission efficiency is obtained.

In the present invention, the organic electroluminescent element preferably contains electron blocking layer 2 provided adjacent to electron blocking layer 1 and between hole blocking layer 1 and the anode, whereby an organic electroluminescent element exhibiting longer life and a higher emission efficiency is obtained.

In the present invention, a hole blocking layer is a layer containing a hole blocking material, and it transports electrons to the light emitting layer while suppressing effusion of holes from the light emitting layer, whereby the recombination probability of holes with electrons is increased.

A hole blocking material is a compound which has the role to block holes (electron holes) drifted from the light emitting layer and to efficiently transport electrons poured from the direction of the cathode to the direction of the light emitting layer.

The properties desired for a hole blocking materials are as follows:
the following condition is satisfied $$Ip2-Ip1 > Ez2-Ea1,$$

provided that Ip1 and Ea1 represent the ionization potential and the electron affinity of the light emitting layer, respectively, and Ip2 and Ea2 represent the ionization potential and the electron affinity of the hole blocking layer, respectively; and the energy of the excited triplet state of the hole blocking material is larger than the energy of the excited triplet state of the light emitting layer.

Examples of a hole blocking material include complexes such as: a styryl compound, a triazole derivative, a phenanthroline derivative, an oxydiazole derivative, a boron derivative, a carbazole derivative, a silole derivative, and an alminum complex.

As other examples of a hole blocking materials, the compounds disclosed in JP-A Nos. 2003-31367, 2003-31368 and Japanese Patent No. 2721441 are listed.

Further listed as a hole blocking material are the following compounds:

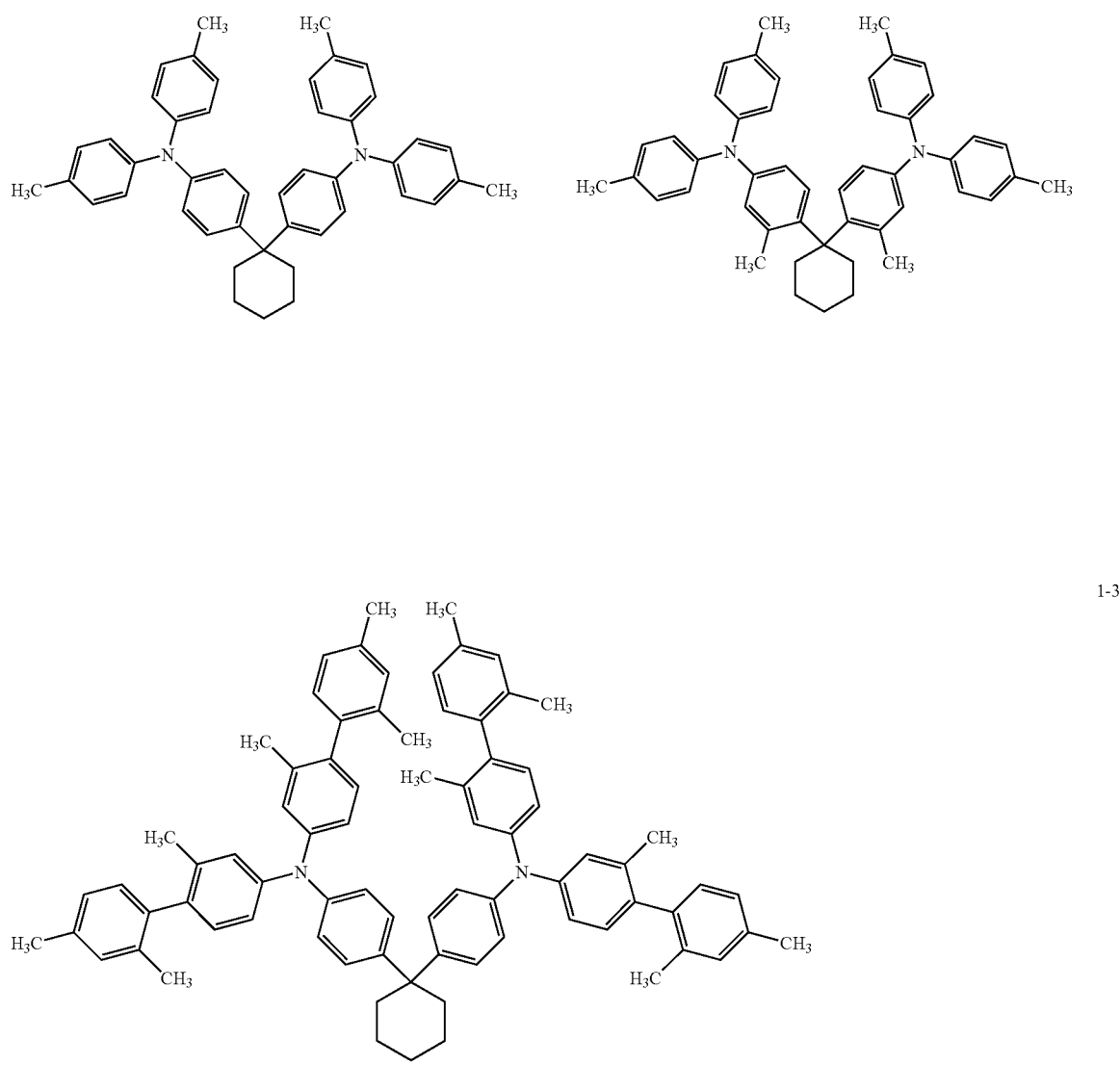

1-4
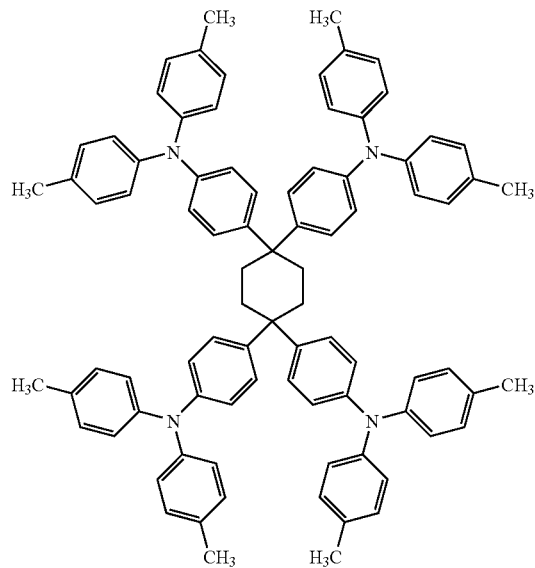
1-5
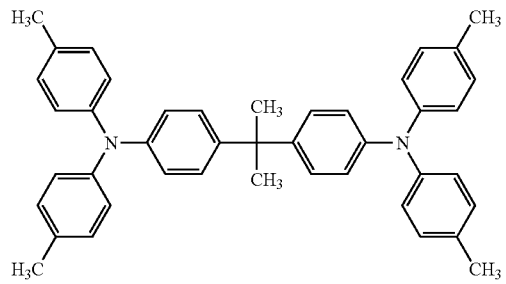
1-6
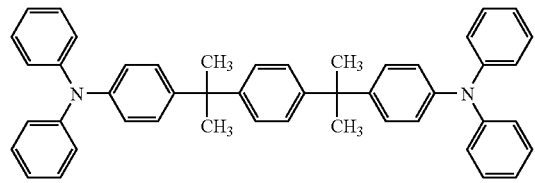
1-7
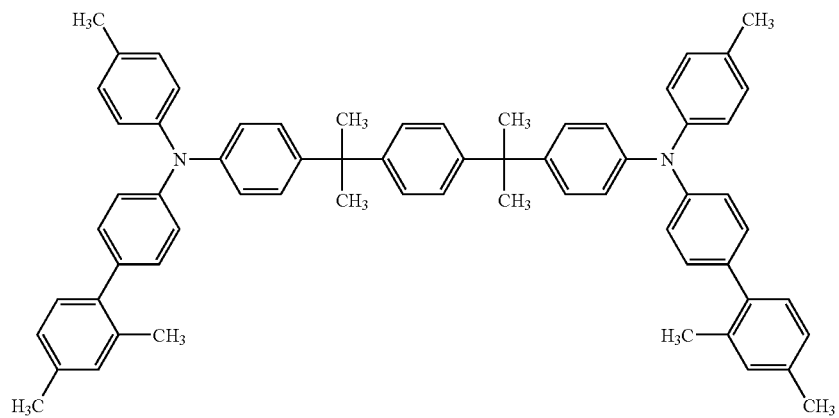

-continued
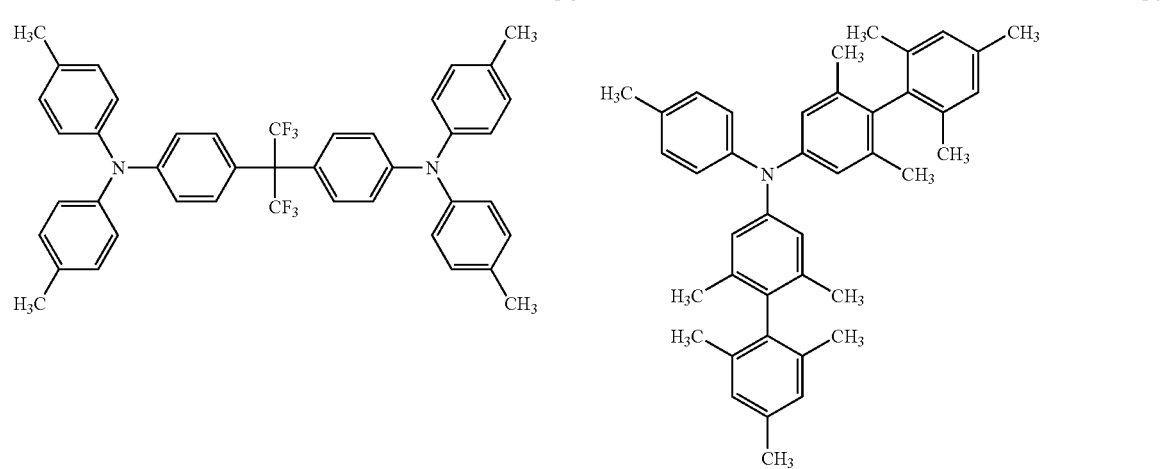
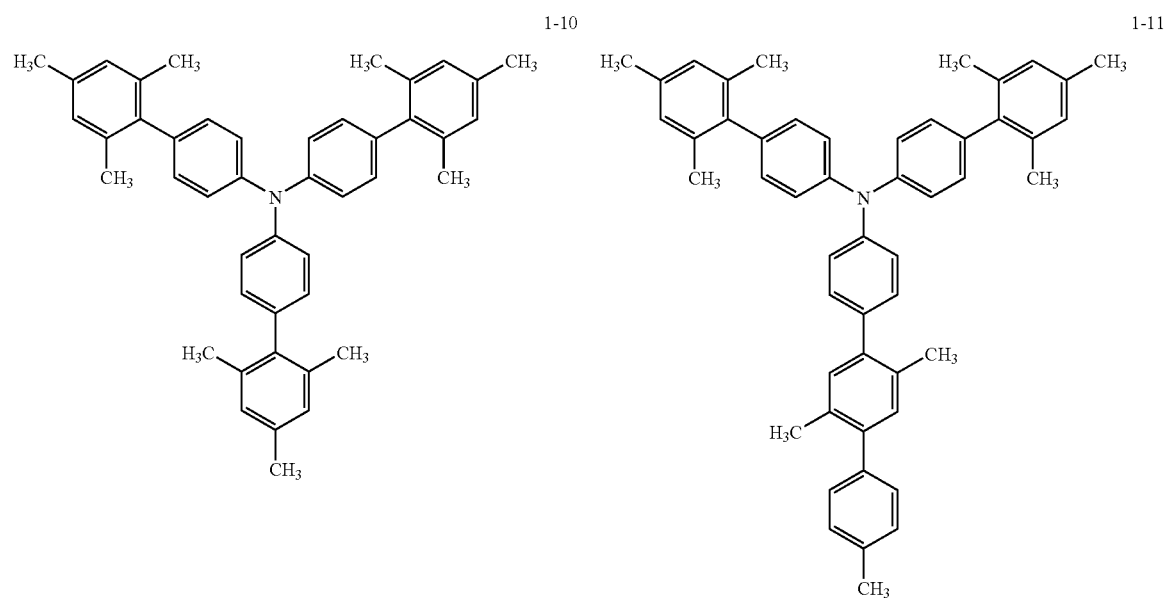

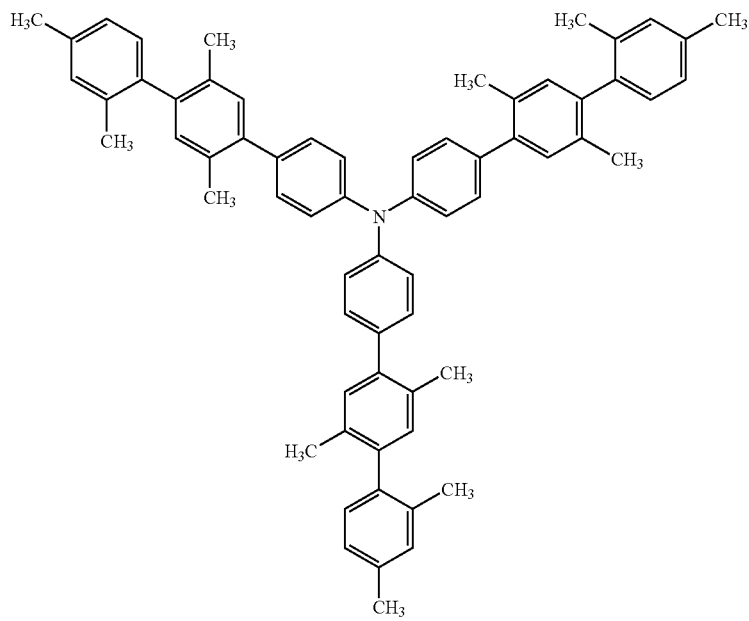
1-12
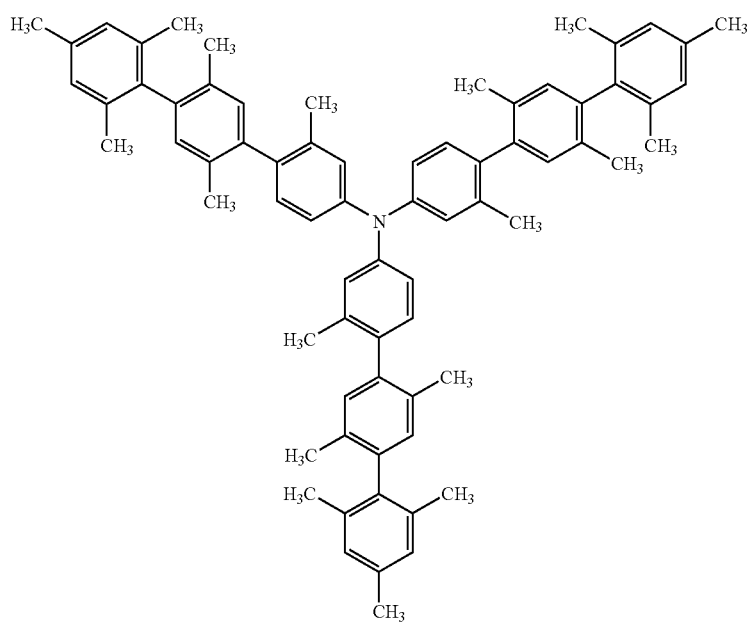
1-13

-continued
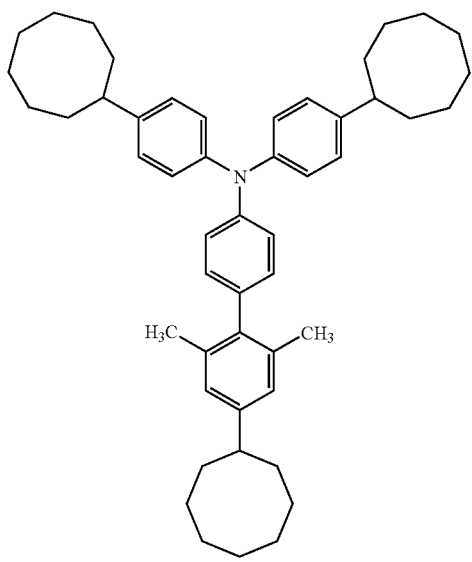
1-14
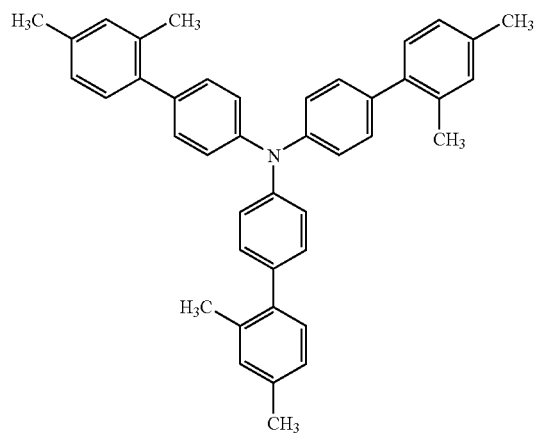
1-15
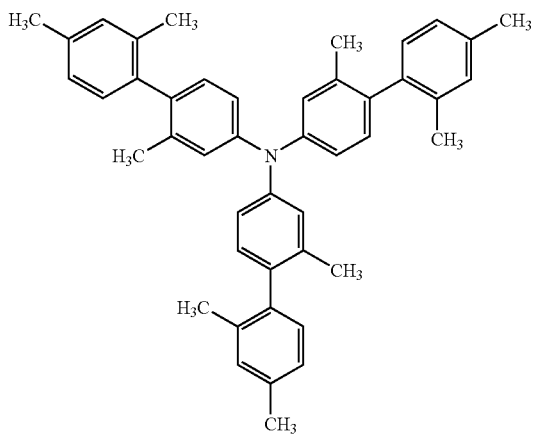
1-16
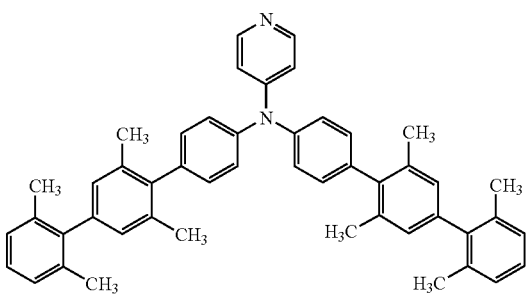
1-17
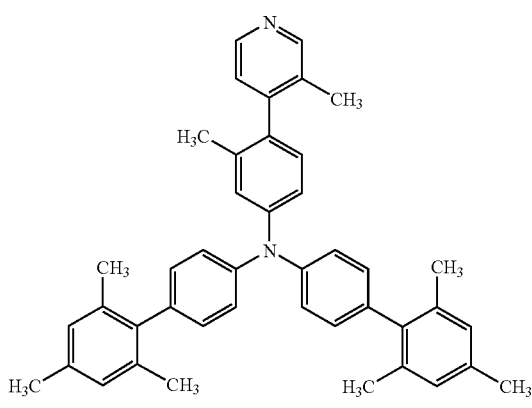
1-18
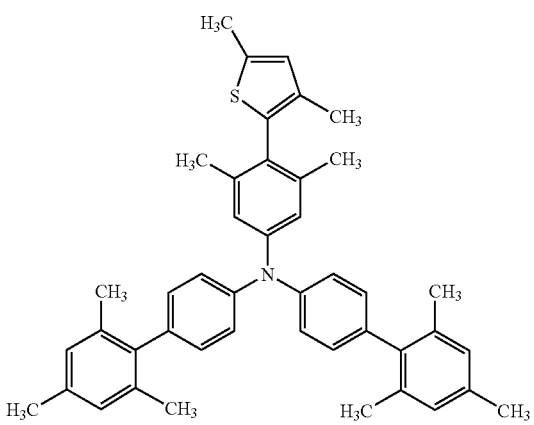
1-19

-continued
1-20
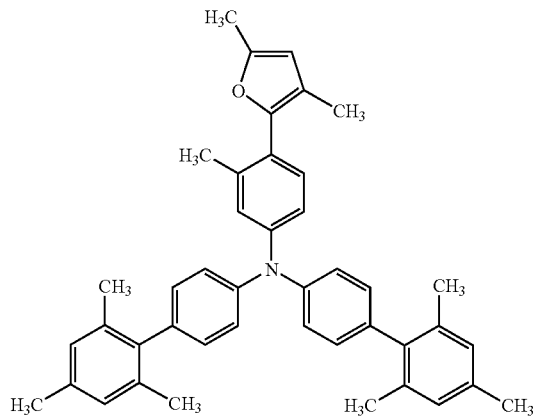
1-21
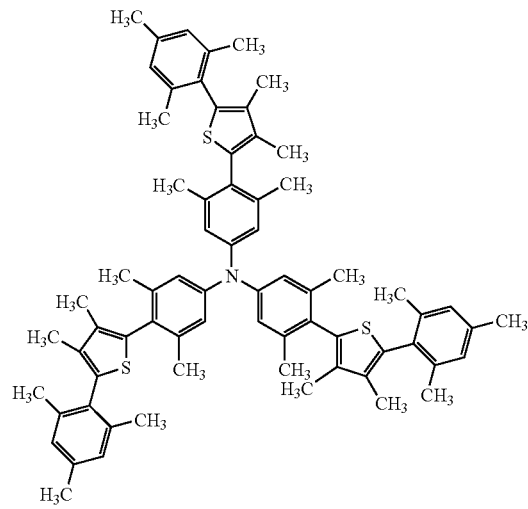
1-22
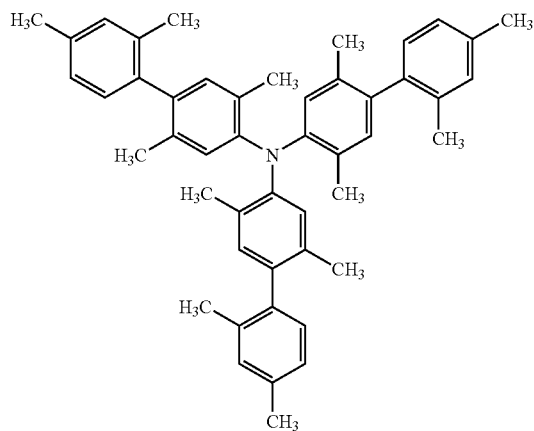
1-23
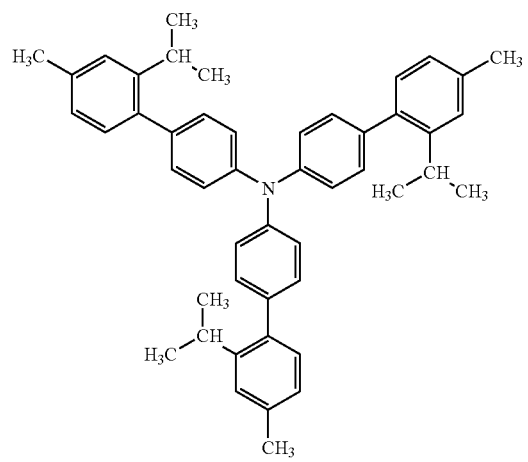
1-24
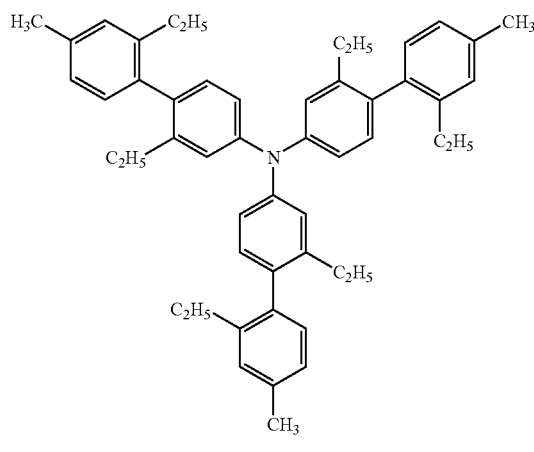
1-25
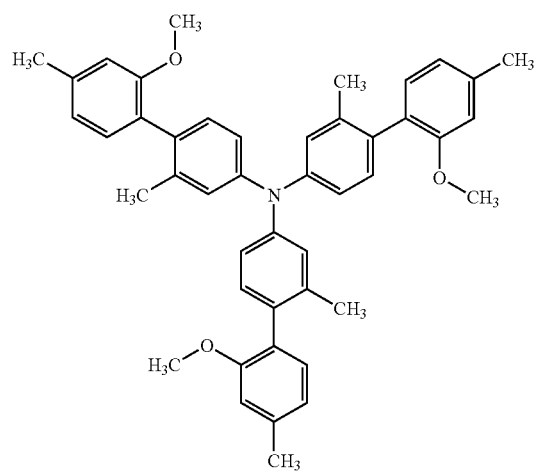

-continued
1-26
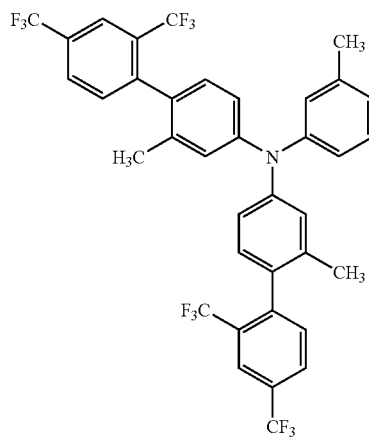
1-27
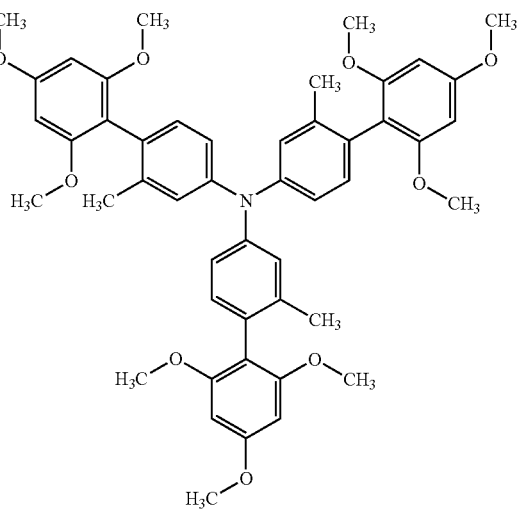
1-28
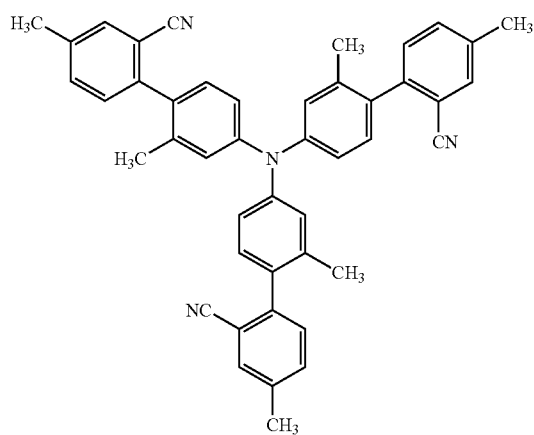
1-29
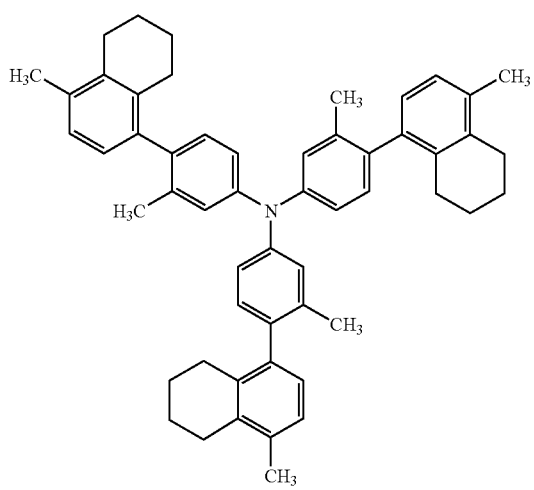
1-30
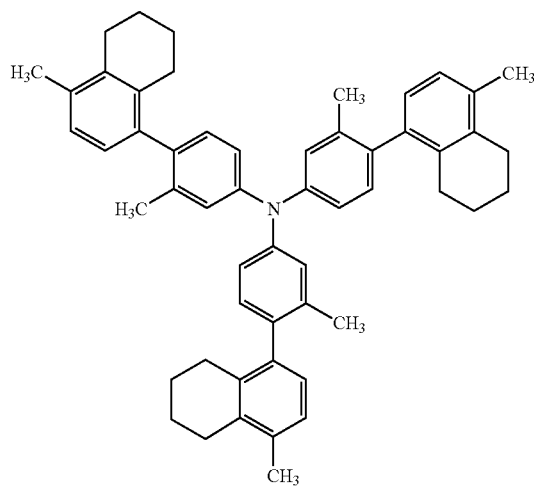
1-31
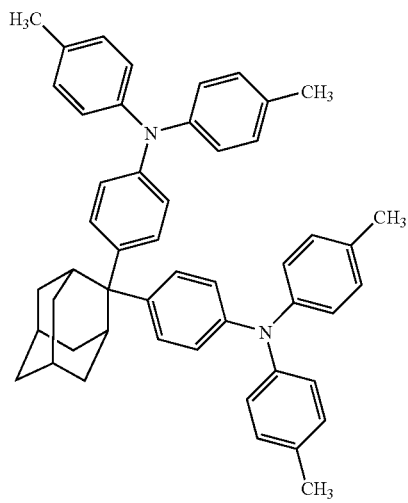

-continued
1-32
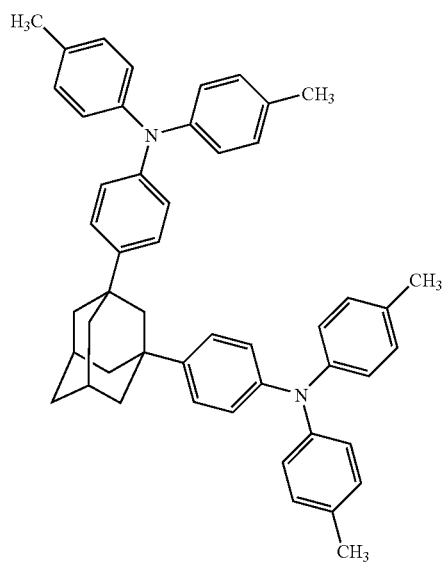
1-33
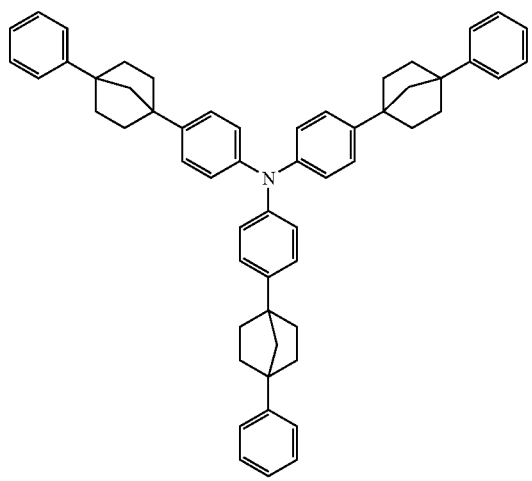
1-34
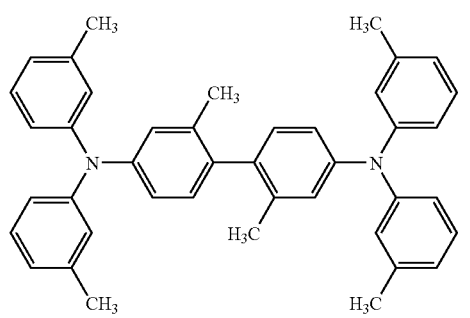
1-35
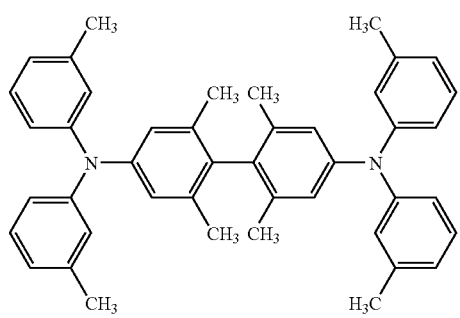
1-36
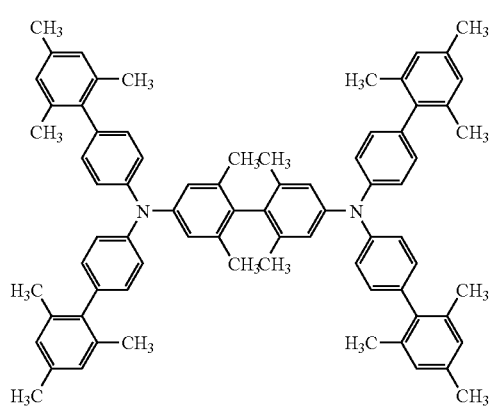
1-37
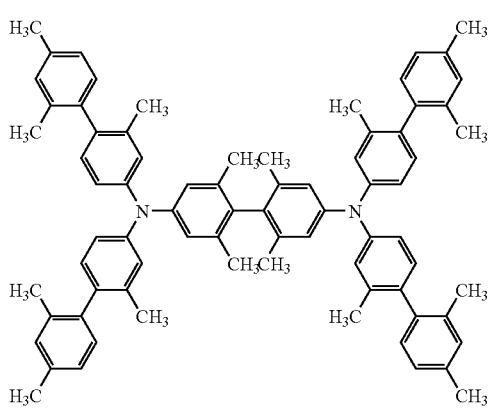
1-38
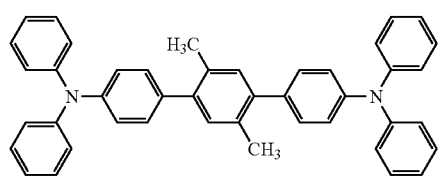
1-39
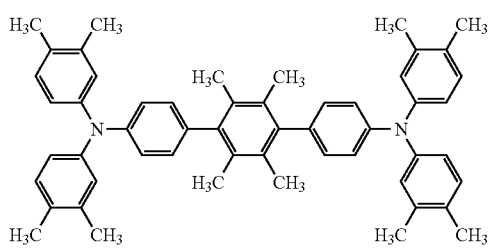

-continued
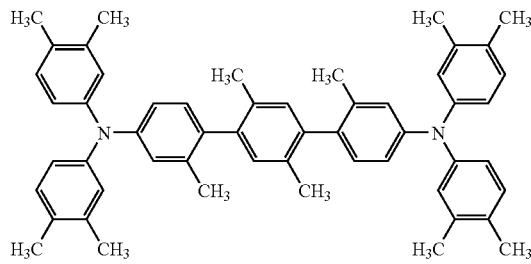
1-40
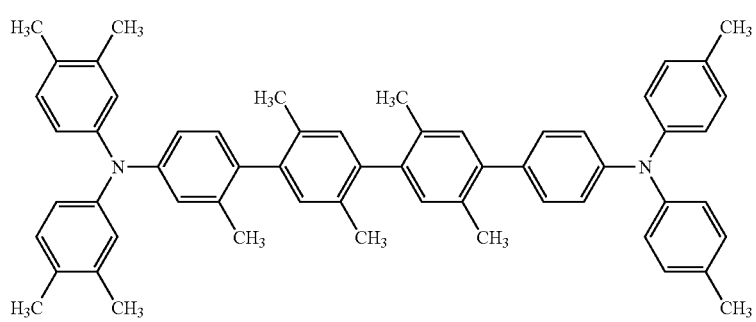
1-41
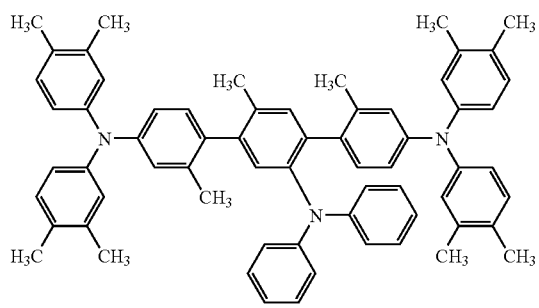
1-42
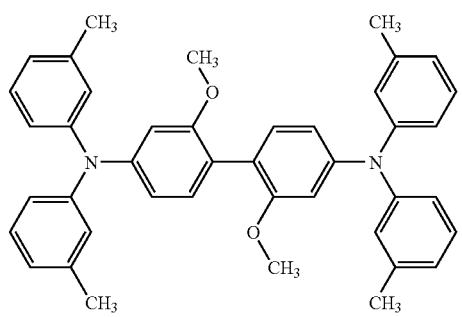
1-43
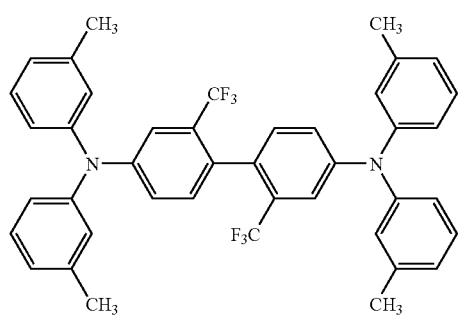
1-44
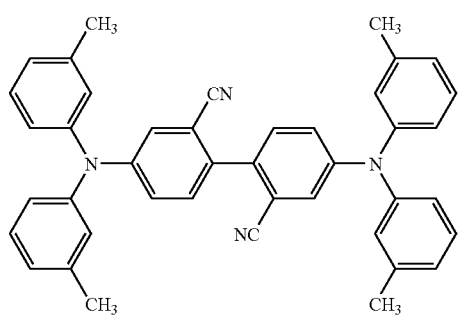
1-45
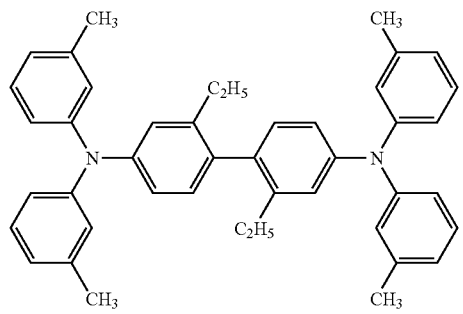
1-46
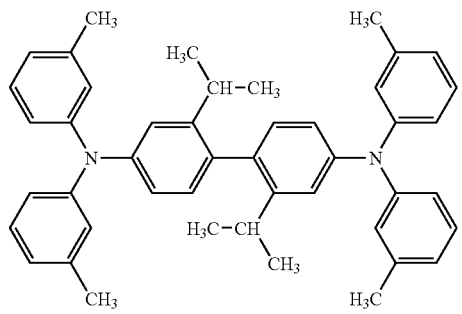
1-47

1-48
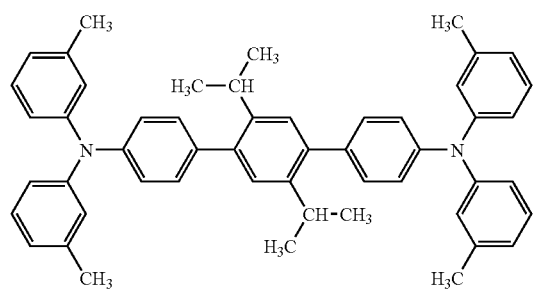
1-49
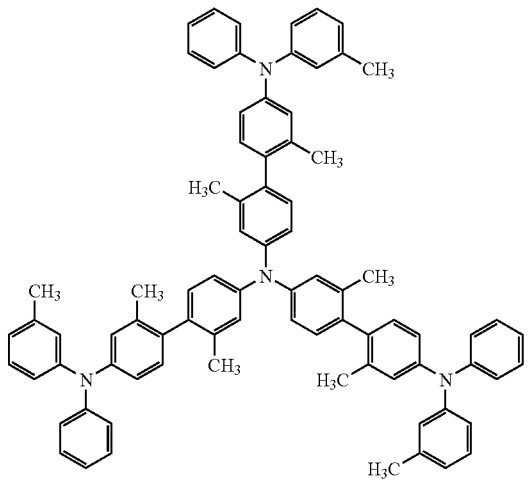
1-50
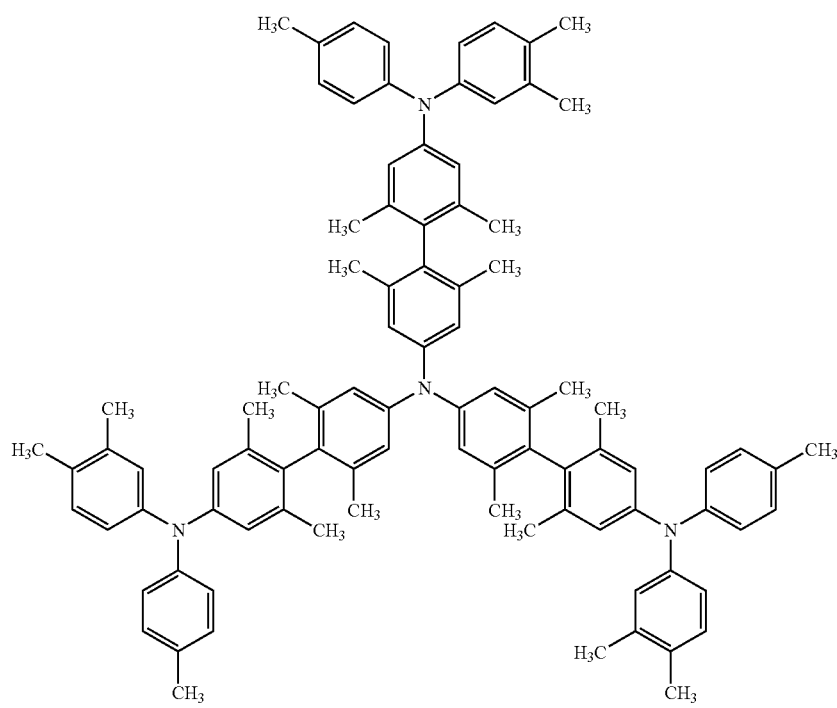

1-51
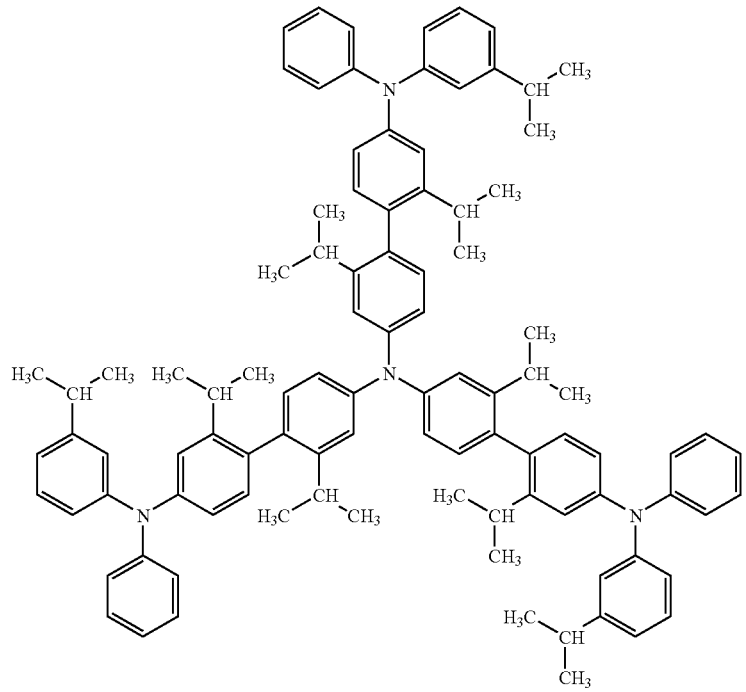
1-52
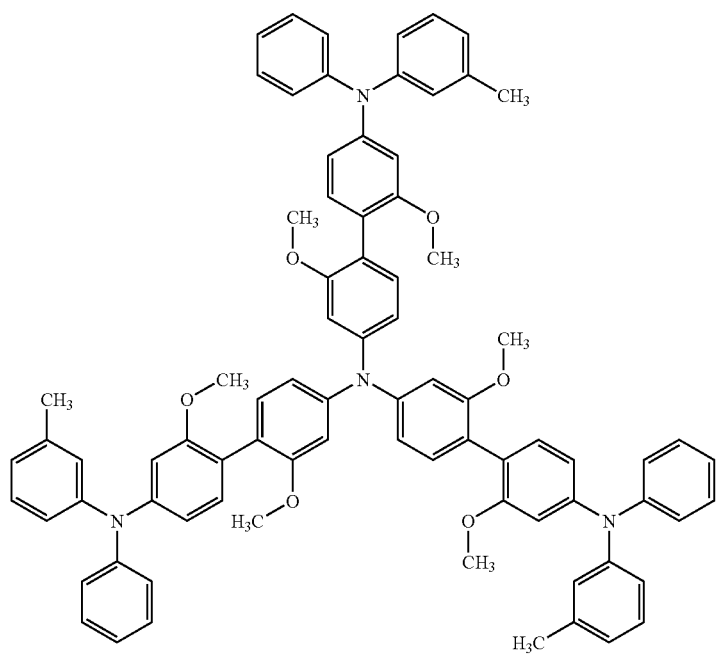

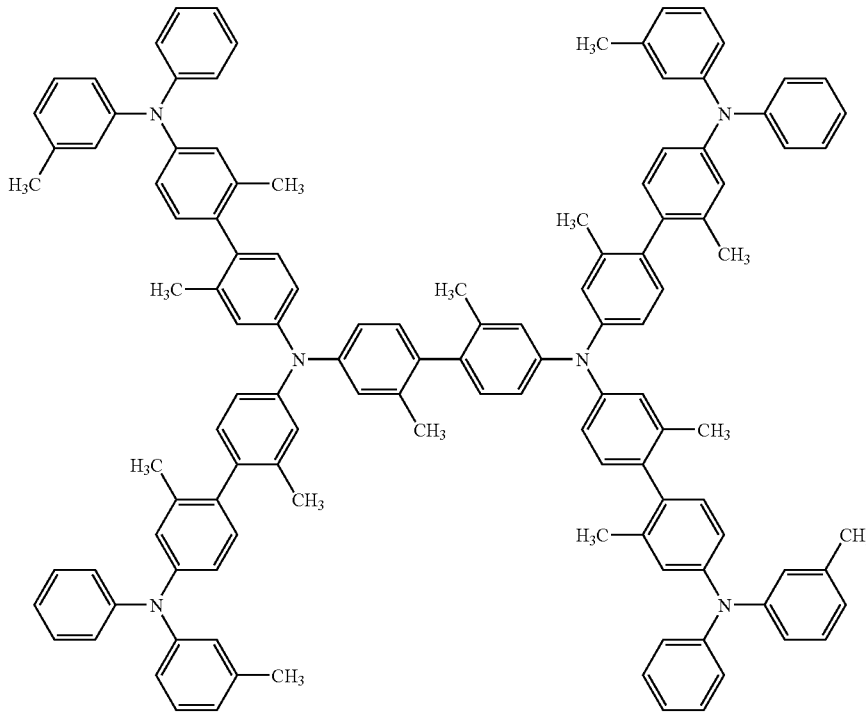
1-53
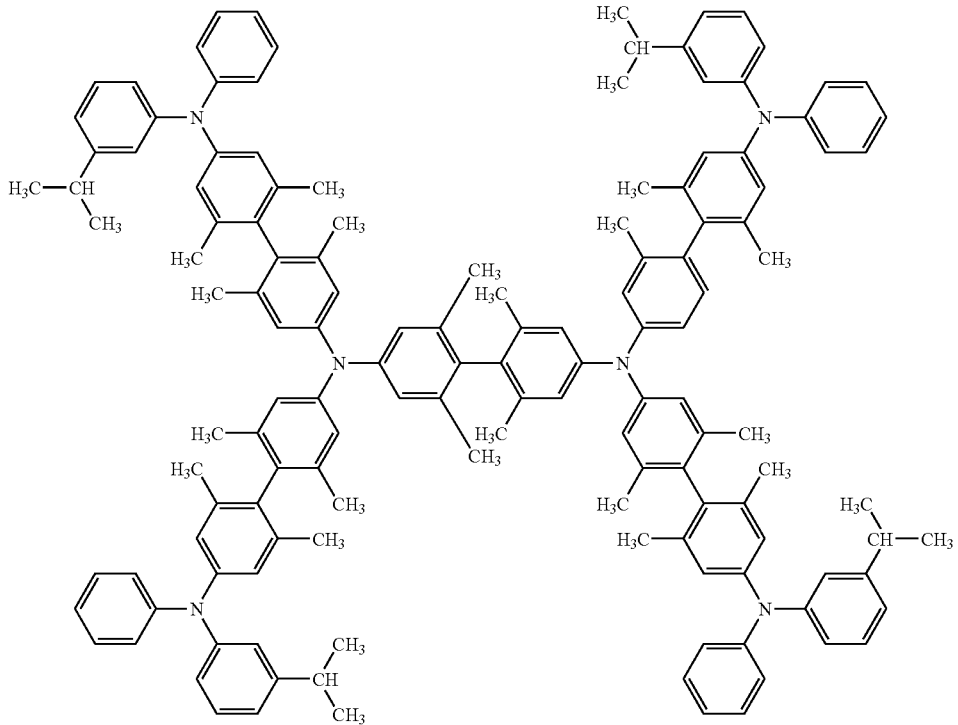
1-54

-continued
1-55
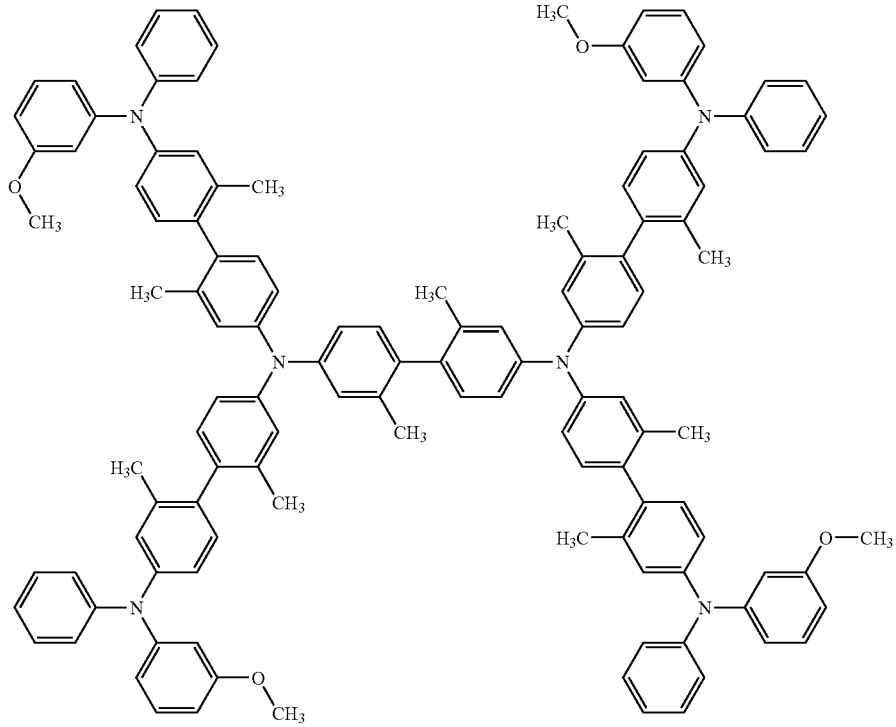
1-56
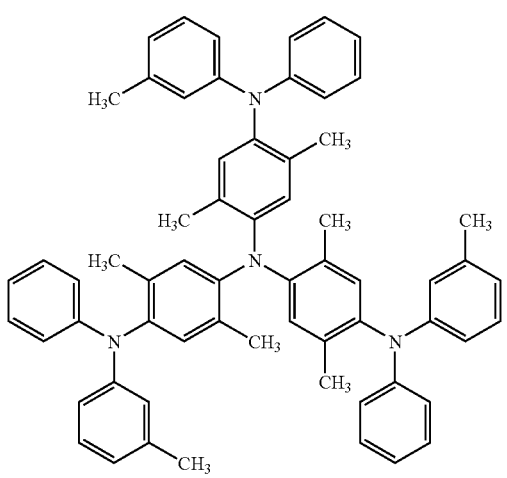

1-57
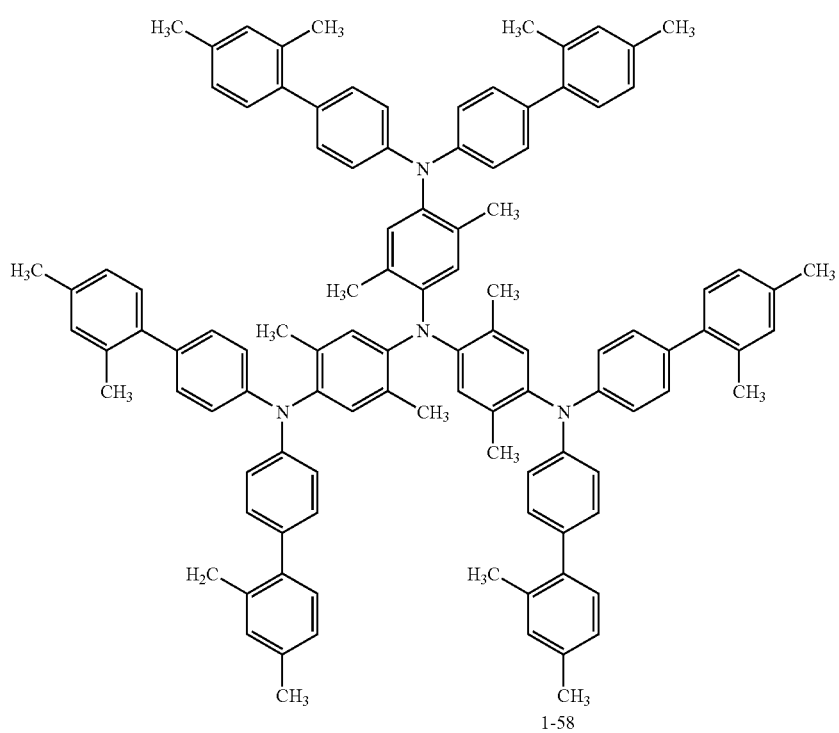
1-58
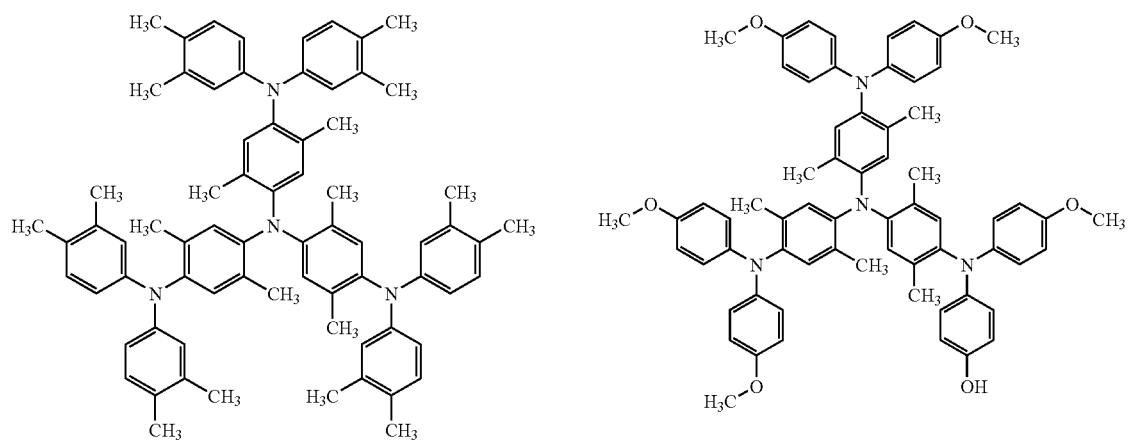
1-59
1-60
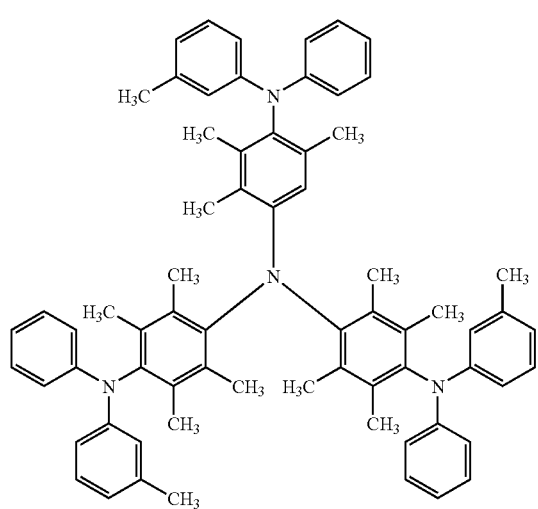

-continued 1-61

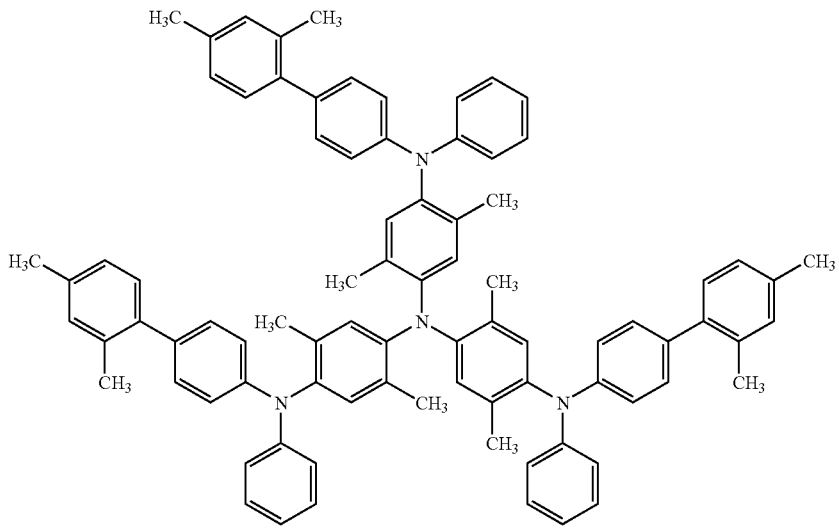

An electron blocking layer is a layer containing an electron blocking material, and it transports holes to the light emitting layer while suppressing effusion of electrons from the light emitting layer, whereby the recombination probability of holes with electrons are increased.

An electron blocking material is a compound which has the roles to block electrons drifted from the light emitting layer and to efficiently transport holes poured from the direction of the anode to the direction of the light emitting layer.

The properties desired for an electron blocking materials are as follows:

the following condition is satisfied $Ea1-Ea3>Ip1-Ip3$, provided that Ip1 and Ea1 represent the ionization potential and the electron affinity of the light emitting layer, respectively, and Ip3 and Ea3 represent the ionization potential and the electron affinity of the electron blocking layer, respectively; and the energy of the excited triplet state of the electron blocking material is larger than the energy of the excited triplet state of the light emitting layer.

Ionization potential is defined as the energy required to emit an electron in the HOMO (Highest Occupied Molecular Orbital) level of a compound to a vacuum level.

Specifically, it is the energy required to pick out an electron from the compound of a membrane state (layer state), which can be measured directly by photoelectron spectroscopy, for example, by using ESCA 5600, UPS (ultraviolet photoemission spectroscopy), produced by ULVAC-PHI, INC.

Electron affinity is defined as the energy generated when an electron in a vacuum level falls in a LUMO (lowest unoccupied molecular orbital) level of a compound to be stabilized, and is obtained by the following formula:

Electron affinity $(eV)$=Ionization potential $Ip$ $(eV)$+ Band gap $(eV)$

The band gap represents the energy of HOMO-LUMO of a compound, and can be determined from the absorption edges of an absorption spectrum of a membrane formed on a quartz substrate.

As electron blocking materials, for example, a triarylamine derivative and a carbazole derivative are listed.

The inventors of the present invention, as a result of the examination, have found that an organic electroluminescent (EL) element exhibiting long life and a high emission efficiency is obtained by an organic electroluminescent element comprising an anode and a cathode having therebetween a light emitting layer containing a phosphorescent compound, and hole blocking layer 1 provided adjacent to the light emitting layer and between the light emitting layer and the cathode, wherein hole blocking layer 1 contains a phosphorescent compound so that the amount of light emitted from hole blocking layer 1 is in the range of 0.1 to 50% of the amount of light emitted from the light emitting layer.

Namely, the present inventors have found that, by controlling the amount of the phosphorescent compound contained in hole blocking layer 1 so that the amount of light emitted from hole blocking layer 1 is in the range of 0.1 to 50% of the amount of light emitted from the light emitting layer, the holes migrated into hole blocking layer 1 are stabilized by light emission from the light emitting material contained in hole blocking layer 1, whereby deterioration of hole blocking layer 1 is suppressed, and an elongation of the life of the organic EL element is attained. Also found has been that, by enlarging the recombination region, the concentration of the triplet exciton is reduced and the occurrence of T-T annihilation is suppressed, whereby the emission efficiency of the organic El element is increased.

The inventors of the present invention, as a result of the examination, have found that an organic electroluminescent (EL) element exhibiting long life and a high emission efficiency is obtained by an organic electroluminescent element comprising an anode and a cathode having therebetween a light emitting layer containing a phosphorescent compound, and electron blocking layer 1 provided adjacent to the light emitting layer and between the light emitting layer and the anode, wherein electron blocking layer 1 contains a phosphorescent compound so that the amount of light emitted from electron blocking layer 1 is in the range of 0.1 to 50% of the amount of light emitted from the light emitting layer.

Namely, the present inventors have found that, by controlling the amount of the phosphorescent compound contained in electron blocking layer 1 so that the amount of light emitted from electron blocking layer 1 is in the range of 0.1 to 50% of the amount of light emitted from the light emitting layer, the electrons migrated into electron blocking layer 1 are stabilized by light emission from the light emitting material contained in electron blocking layer 1, whereby deterioration of electron blocking layer 1 is suppressed, and an elongation of the life of the organic EL element is attained. Also found has been that, by enlarging the recombination region, the concentration of the triplet exciton is reduced and the occurrence of T-T annihilation is suppressed, whereby the emission efficiency of the organic EL element is increased.

The inventors of the present invention, as a result of the examination, have found that an organic electroluminescent (EL) element exhibiting longer life and a higher emission efficiency is obtained by an organic electroluminescent element comprising an anode and a cathode having therebetween a light emitting layer containing a phosphorescent compound; hole blocking layer 1 provided adjacent to the light emitting layer and between the light emitting layer and the cathode; and electron blocking layer 1 provided adjacent to the light emitting layer and between the light emitting layer and the anode, wherein hole blocking layer 1 contains a phosphorescent compound so that the amount of light emitted from hole blocking layer 1 is in the range of 0.1 to 50% of the amount of light emitted from the light emitting layer; and electron blocking layer 1 contains a phosphorescent compound so that the amount of light emitted from electron blocking layer 1 is in the range of 0.1 to 50% of the amount of light emitted from the light emitting layer.

In hole blocking layer 1, the phosphorescent compound is preferably contained so that the amount of light emitted from hole blocking layer 1 is in the range of 3 to 50% of the amount of light emitted from the light emitting layer, whereby an organic electroluminescent element exhibiting longer life and a higher emission efficiency is obtained.

In electron blocking layer 1, the phosphorescent compound is preferably contained so that the amount of light emitted from electron blocking layer 1 is in the range of 3 to 50% of the amount of light emitted from the light emitting layer, whereby an organic electroluminescent element exhibiting longer life and a higher emission efficiency is obtained.

Herein, phosphorescent light emission is measured by using electrolytic luminescence.

In the present invention, a phosphorescent compound is used as a luminescent material, whereby a high emission efficiency is acquired.

The phosphorescent compound of the present invention is suitably chosen from the known compounds used for the light emitting layer of the organic EL element, examples of which include: iridium complexes disclosed in JP-A No. 2001-247859 or in pp 16-18 of WO00/70,655; osmium complexes; platinum complexes such as 2,3,7,8,12,13,17,18-octaethyl-21H, 23H-porphyrin platinum complex. By using such a phosphorescent compound as a dopant, an organic EL element exhibiting a high internal quantum efficiency is obtained. The phosphorescent compound used in the present invention is preferably a complex compound having a metal of Group 8 of the periodic table, and more preferably an iridium compound, an osmium compound, a platinum compound (a platinum complex compound), or a rare earth metal complex compound. Of these, most preferable is an iridium compound.

Examples of the phosphorescent compound used in the present invention are shown below, however, the present invention is not limited thereto. These compounds can be prepared by a method, for example, reported in Inorg. Chem., Vol 40, 1704-1711.

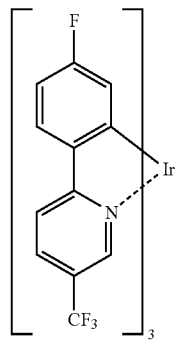

D-1

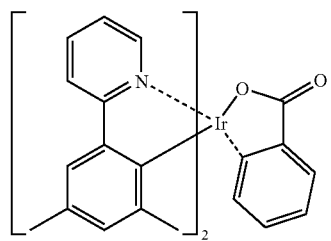

D-2

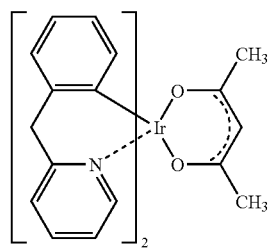

D-3

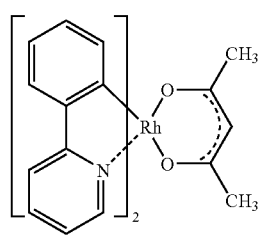

D-4

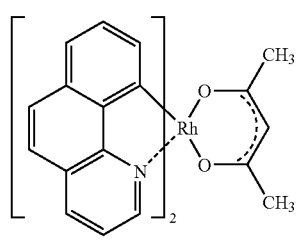

D-5

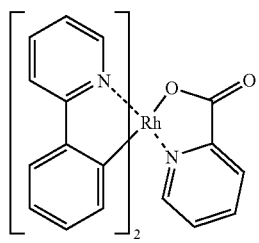
D-6
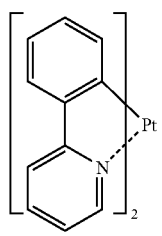
Pt-1
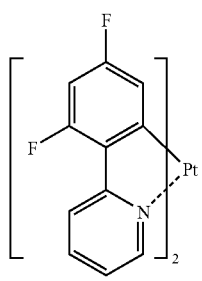
Pt-2
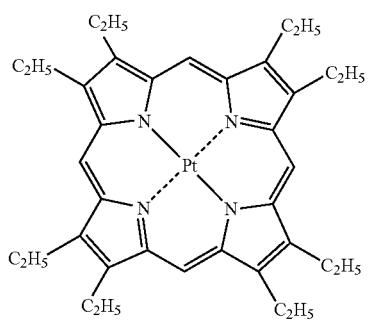
Pt-3
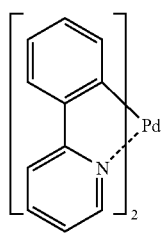
Pd-1
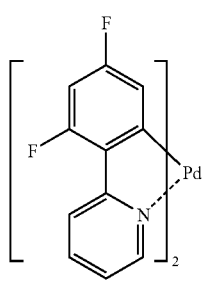
Pd-2
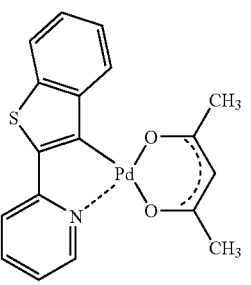
Pd-3
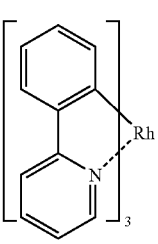
Rh-1
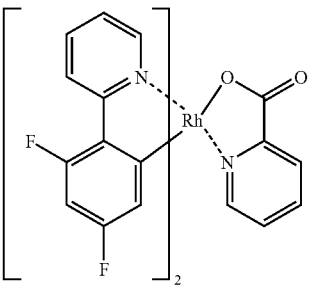
Rh-2
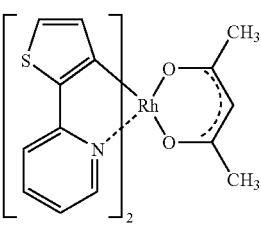
Rh-3
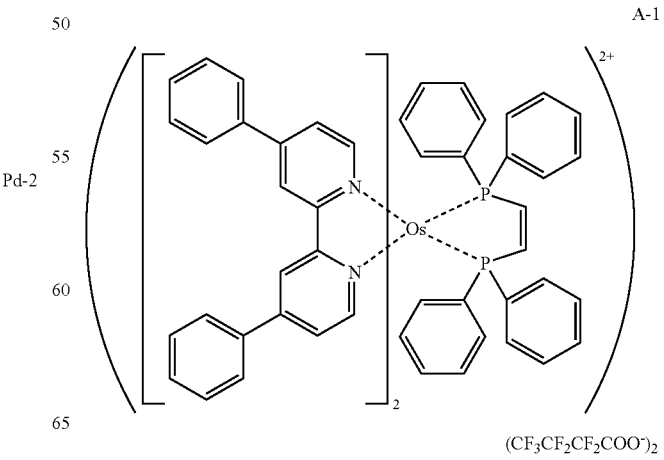
A-1

-continued
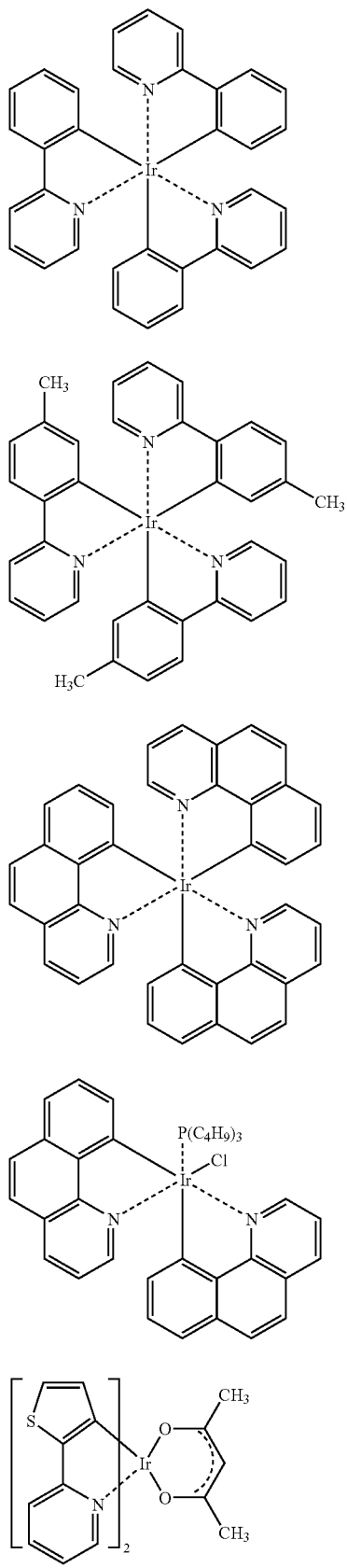
Ir-1
Ir-2
Ir-3
Ir-4
Ir-5
-continued
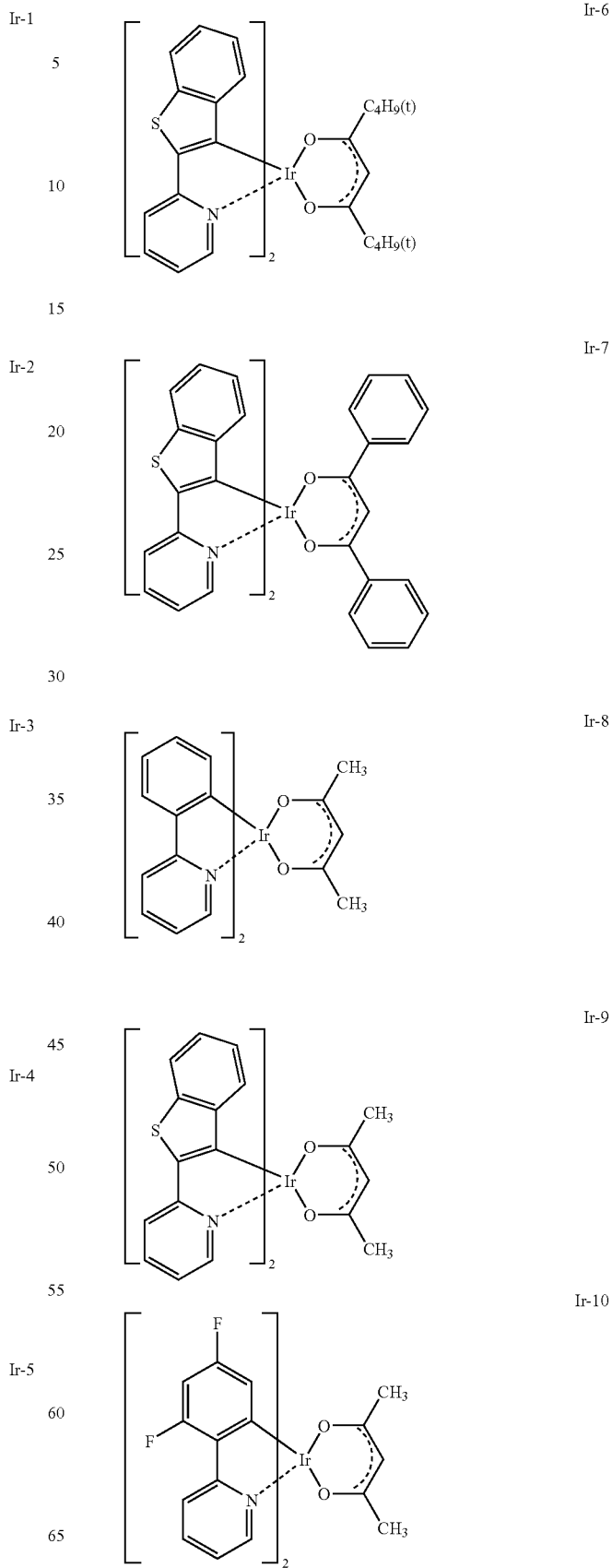
Ir-6
Ir-7
Ir-8
Ir-9
Ir-10

-continued

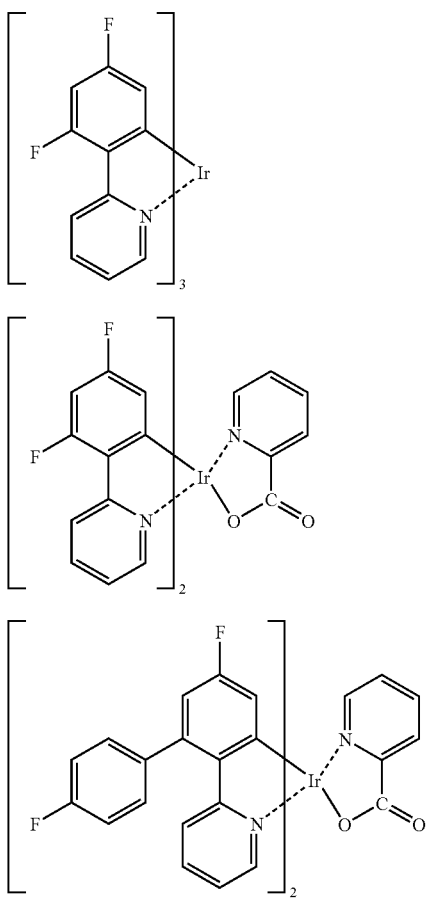

In addition to the above compounds, listed are the following compounds: iridium compounds represented by the formulas or listed as examples in J. Am. Chem. Soc., Vol. 123, pp 4304-4312 (2001), WO00/70655, WO02/15645, JP-A No. 2001-247859, JP-A No. 2001-345183, JP-A No. 2002-117978, JP-A No. 2002-170684, JP-A No. 2002-203678, JP-A No. 2002-235076, JP-A No. 2002-302671, JP-A No. 2002-324679, JP-A No. 2002-332291, JP-A No. 2002-332292 and JP-A No. 2002-338588; and the iridium complex represented by General Formula (IV) in JP-A No. 2002-8860.

The phosphorescence quantum yield in a solution of the phosphorescent compound of the present invention is 0.001 or more at 25° C., but it is preferably 0.01 or more and furthermore preferably 0.1 or more.

The phosphorescence quantum yield can be measured according to a method described in the fourth edition "Jikken Kagaku Koza 7", Bunko II, page 398 (1992) published by Maruzen.

The constituting layers of the organic EL element of the present invention will be explained below in details.

Preferred examples of the constituting layers of the organic EL element of the present invention will be shown below, however, the present invention is not limited thereto.

(1): Anode/Hole transport layer/Light emitting layer/Hole blocking layer 1/Electron transport layer/Cathode
(2): Anode/Hole transport layer/Light emitting layer/Hole blocking layer 1/Hole blocking layer 2/Electron transport layer/Cathode
(3): Anode/Hole transport layer/Electron blocking layer 1/Light emitting layer/Electron transport layer/Cathode
(4): Anode/Hole transport layer/Electron blocking layer 2/Electron blocking layer 1/Light emitting layer/Electron transport layer/Cathode
(5): Anode/Hole transport layer/Electron blocking layer 1/Light emitting layer/Hole blocking layer 1/Electron transport layer/Cathode
(6): Anode/Hole transport layer/Electron blocking layer 2/Electron blocking layer 1/Light emitting layer/Hole blocking layer 1/Hole blocking layer 2/Electron transport layer/Cathode
(7): Anode/Anode buffer layer/Hole transport layer/Electron blocking layer 2/Electron blocking layer 1/Light emitting layer/Hole blocking layer 1/Hole blocking layer 2/Electron transport layer/Cathode buffer layer/Cathode <Anode>

For the anode of the organic EL element, a metal, an alloy, or an electroconductive compound each having a high working function (not less than 4 eV), and mixture thereof are preferably used as the electrode material. Specific examples of such an electrode material include a metal such as Au, CuI and a transparent electroconductive material such as indium tin oxide (ITO), $SnO_2$, or ZnO. A material capable of forming an amorphous and transparent conductive layer such as IDIXO ($In_2O_3$—ZnO) may also be used. The anode may be prepared by forming a thin layer of the electrode material according to a depositing or sputtering method, and by forming the layer into a desired pattern according to a photolithographic method. When required precision of the pattern is not so high (not less than 100 μm), the pattern may be formed by depositing or sputtering of the electrode material through a mask having a desired form. When light is emitted through the anode, the transmittance of the anode is preferably 10% or more, and the sheet resistance of the anode is preferably not more than several hundred ohm/sq. The thickness of the layer is ordinarily within the range of from 10 nm to 1 μm, and preferably from 10 to 200 nm, although it may vary due to kinds of materials used.

<Cathode>

On the other hand, for the cathode, a metal (also referred to as an electron injecting metal), an alloy, and an electroconductive compound each having a low working function (not more than 4 eV), and a mixture thereof are used as the electrode material. Specific examples of such an electrode material include sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or sputtering method. The sheet resistance as the cathode is preferably not more than several hundred ohm/sq, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

After a layer of the metal described above as a cathode is formed to give a thickness of from 1 to 20 nm, a layer of the transparent electroconductive material as described in the anode is formed on the resulting metal layer, whereby a transparent or semi-transparent cathode can be prepared. Employing the cathode, an element can be manufactured in which both anode and cathode are transparent.

Next, an injection layer, a blocking layer, and an electron transport layer used in the component layer of the organic EL element of the present invention will be explained.

<Buffer Layer>: Cathode Buffer layer, Anode Buffer Layer

The injection layer is optionally provided, for example, a cathode buffer layer (an electron injection layer) or an anode buffer layer (a hole injection layer), and may be provided between the anode and the light emitting layer or hole transport layer, and between the cathode and the light emitting layer or electron transport layer as described above.

The buffer layer herein referred to is a layer provided between the electrode and an organic layer in order to reduce the driving voltage or to improve of light emission efficiency. As the buffer layer there are an anode buffer layer and a cathode buffer layer, which are described in "Electrode Material" pages 123-166, Div. 2 Chapter 2 of "Organic EL element and its frontier of industrialization" (published by NTS Corporation, Nov. 30, 1998) in detail.

The anode buffer layer (hole injection layer) is described in, for example, JP-A Nos. 9-45479, 9-260062, and 8-288069, and its examples include a phthalocyanine buffer layer represented by a copper phthalocyanine layer, an oxide buffer layer represented by a vanadium oxide layer, an amorphous carbon buffer layer, and a polymer buffer layer employing an electroconductive polymer such as polyaniline (emeraldine) and polythiophene.

The cathode buffer layer (an electron injection layer) is described in, for example, JP-A Nos. 6-325871, 9-17574, and 10-74586, in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injection layer) is preferably very thin and has a thickness of preferably from 0.1 to 5 μm depending on kinds of the material used.

<Blocking Layer>: Hole Blocking layer, Electron Blocking Layer

The hole blocking layers are above described hole blocking layer 1 and hole blocking layer 2, both of which prevent effusion of holes from the light emitting layer to obtain an organic EL element exhibiting high luminance and a high emission efficiency.

The electron blocking layers are above described electron blocking layer 1 and electron blocking layer 2, both of which prevent effusion of electrons from the light emitting layer to obtain an organic EL element exhibiting high liminance and a high emission efficiency.

<Light Emitting Layer>

The light emitting layer of the present invention contains a phosphorescent compound and it is a layer where injected electrons and holes are recombined to emit light. The portions where light is emitted may be in the light emitting layer or at the interface between the light emitting layer and the layer adjacent thereto.

By using a phosphorescent compound in the light emitting layer, an organic EL element exhibiting a high emission efficiency is obtained.

As the phosphorescent compound, the above described compounds are usable.

The light emission of the phosphorescent compound is divided in two types in principle: one is an energy transfer type in which recombination of carriers occurs on the host compound to which the carrier is transported to excite the host compound, the resulting energy is transferred to the phosphorescent compound and light is emitted from the phosphorescent compound; and the other is a carrier trap type in which recombination of carriers occurs on the phosphorescent compound which works as a carrier trap material, and light is emitted from the phosphorescent compound. However, in each type, energy level of the phosphorescent compound in excited state is lower than that of the host compound in excited state.

In the present invention, the phosphorescence maximum wavelength of the phosphorescent compound is not specifically limited. Theoretically, the wavelength of the phosphorescence can be varied by selecting a center metal, a ligand, or a substituent of the ligand. The phosphorescent compound is preferably a phosphorescent compound having a phosphorescence maximum wavelength in the region of from 380 to 480 nm. As such organic electroluminescent elements, those emitting a blue or white light are listed.

When the same compound is used in each of the light emitting layer, hole blocking layer 1 and hole blocking layer 2, long life of the organic EL element is attained without changing the emission spectrum, which is one of the objects of the present invention.

The same effect can be obtained by using a different compound in the hole blocking layer or in the electron blocking layer from the compound used in the light emitting layer, when the compounds exhibit the same color.

Further, by using a compound having a slightly different color in the hole blocking layer or in the electron blocking layer from the color of the compound used in the light emitting layer, an organic EL element having a different color can be obtained.

Namely, use of a plurality of phosphorescent compounds enables to mix emissions of different colors and emission of an arbitrary color becomes possible. By adjusting the type and the amount of a phosphorescent compound, emission of white light is possible, which enables to apply the organic EL element to an illuminator and to a backlight of a display.

In the present invention, white light emission may be used, which is obtained by changing the type and the amount of the phosphorescent compound used in the hole blocking layer or in the electron blocking layer, from the compound used in the light emitting layer.

The light emitting layer may also contain a host compound.

In the present invention, "host compound" is defined as a compound of which phosphorescent quantum yield is less than 0.01.

In the present invention, as a host compound, above mentioned organic EL element materials are preferably employed, whereby a higher emission efficiency is obtained.

A plurality of host compounds known in the art may be used in combination. By using a plurality of host compound, charge transfer is more easily controlled, whereby higher emission efficiency of an organic EL element is obtained.

Among those host compounds known in the art, preferable are those having hole transporting ability, electron transport ability and a higher Tg (a glass transition temperature) value, while preventing elongation of the emission wavelength.

Examples of known host compound include the compounds disclosed in the following documents:
JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.
Further, the following compounds are also listed as a host compound.
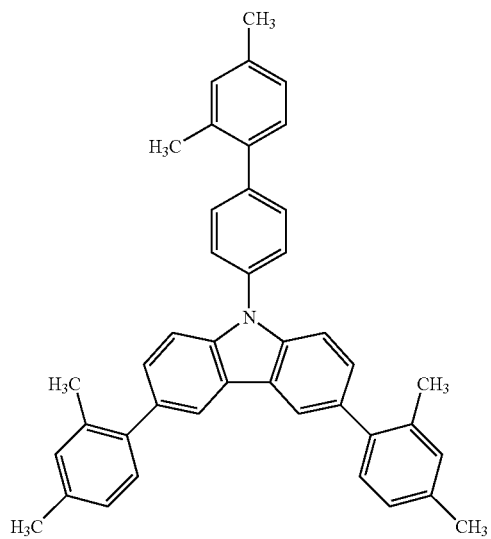
2-1
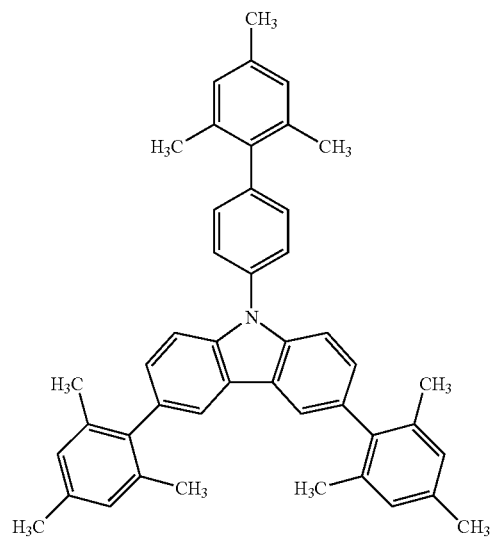
2-2
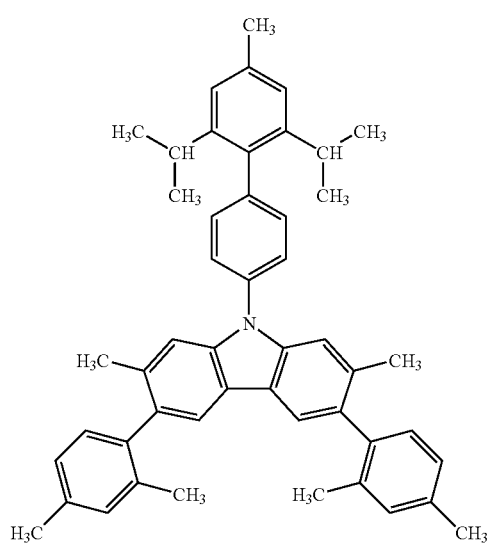
2-3
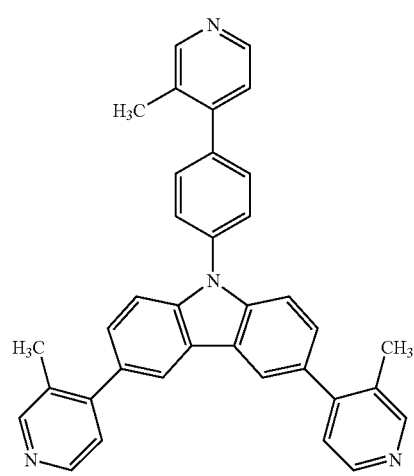
2-4

-continued
2-5
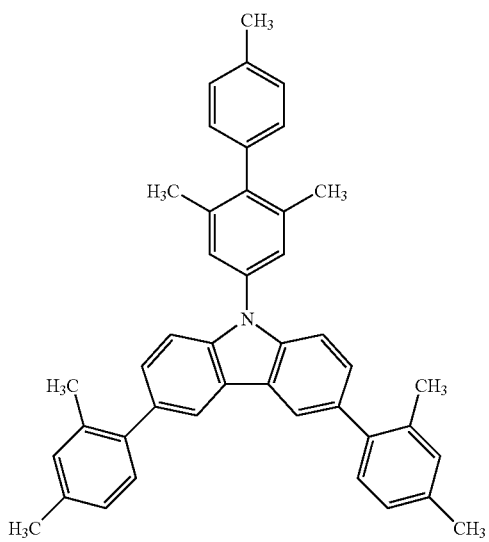
2-6
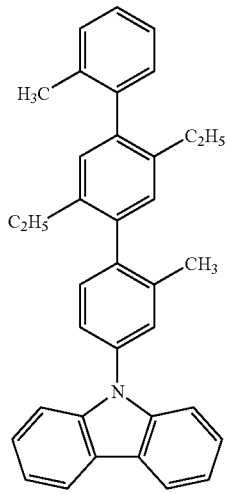
2-7
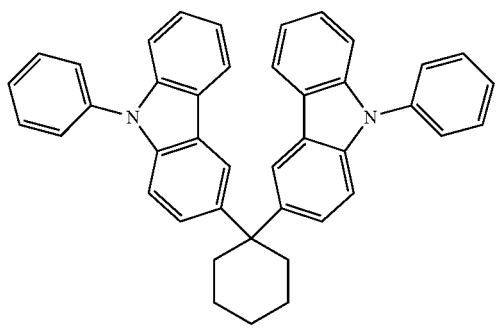
2-8
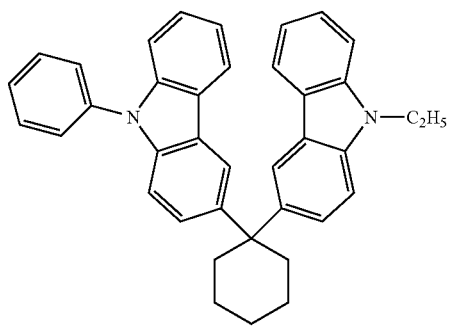
2-9
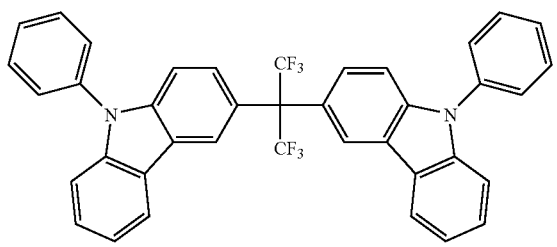
2-10
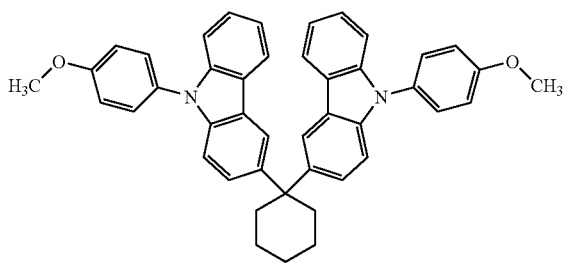
2-11
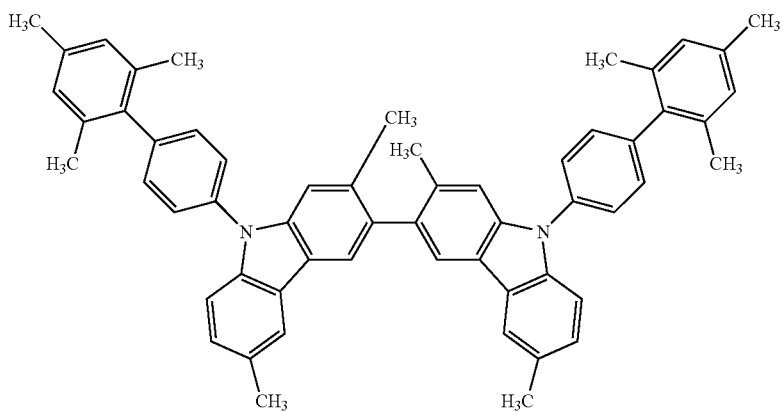

-continued
2-12
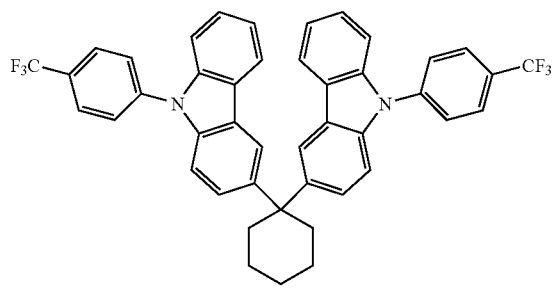
2-13
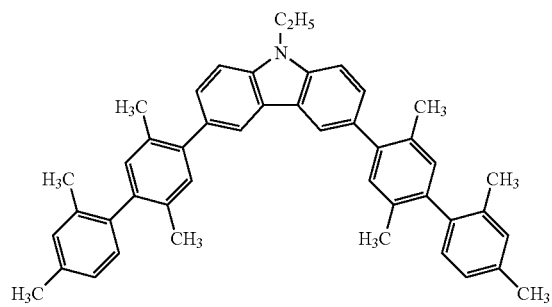
2-14
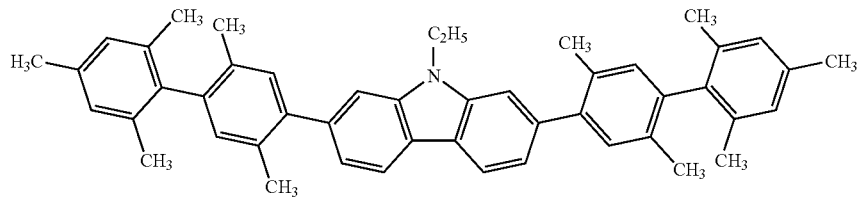
2-15
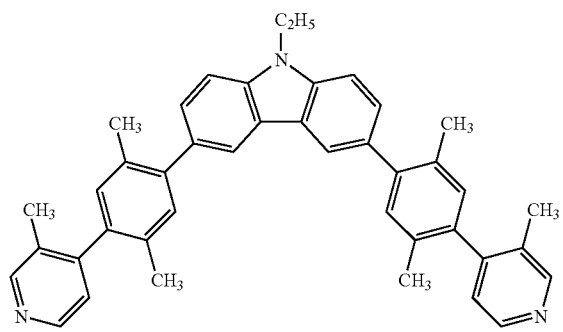
2-16
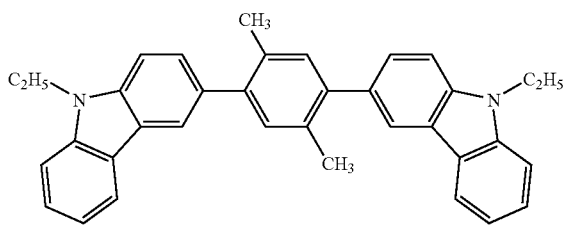
2-17
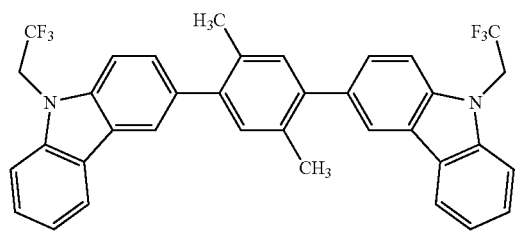
2-18
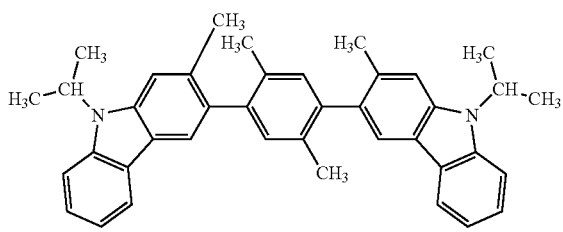
2-19
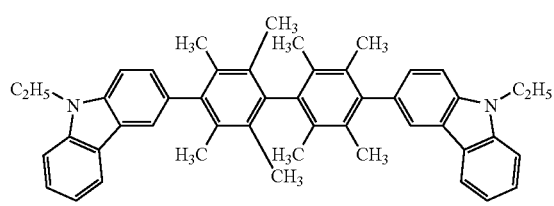
2-20
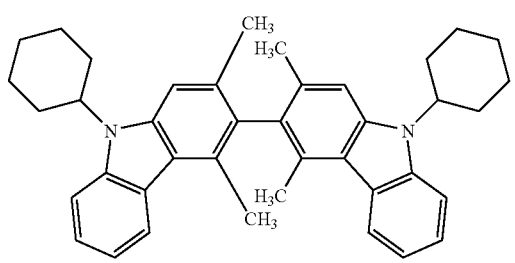

-continued
2-21
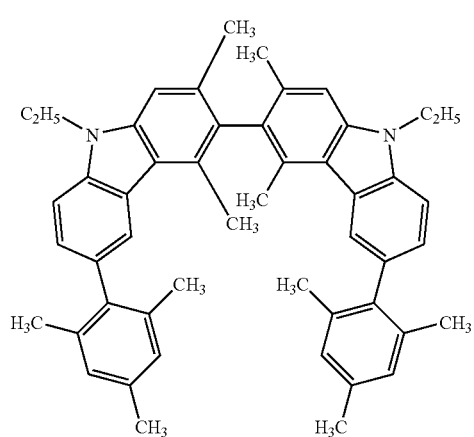
2-22
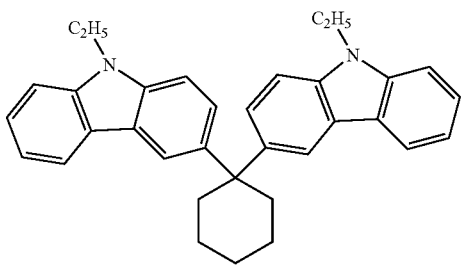
2-23
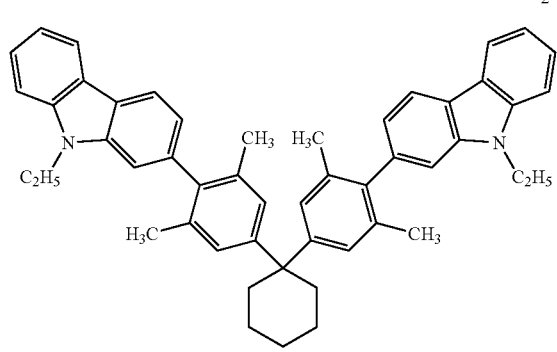
2-24
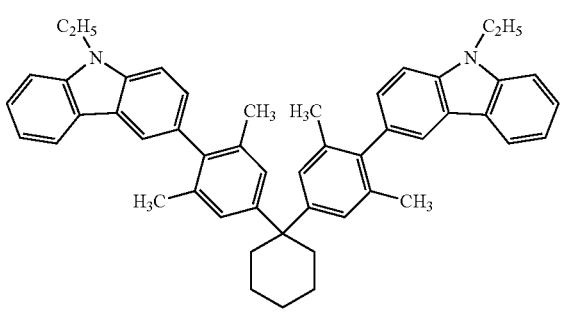
2-25
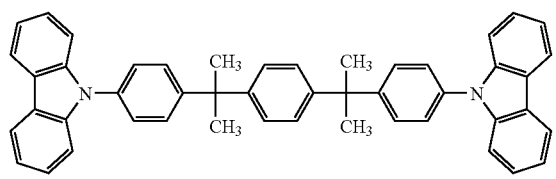
2-26
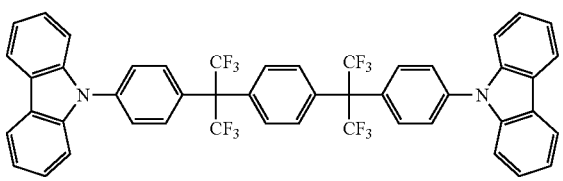
2-27
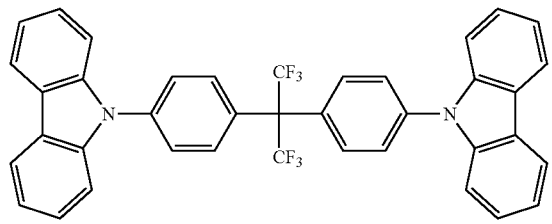
2-28
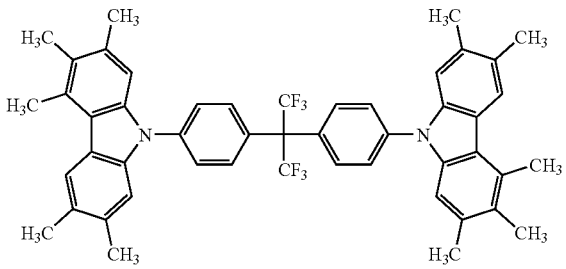

-continued
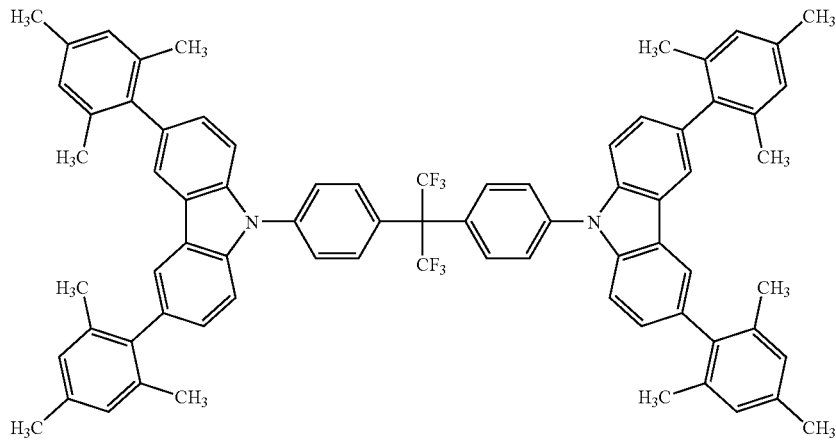
2-29
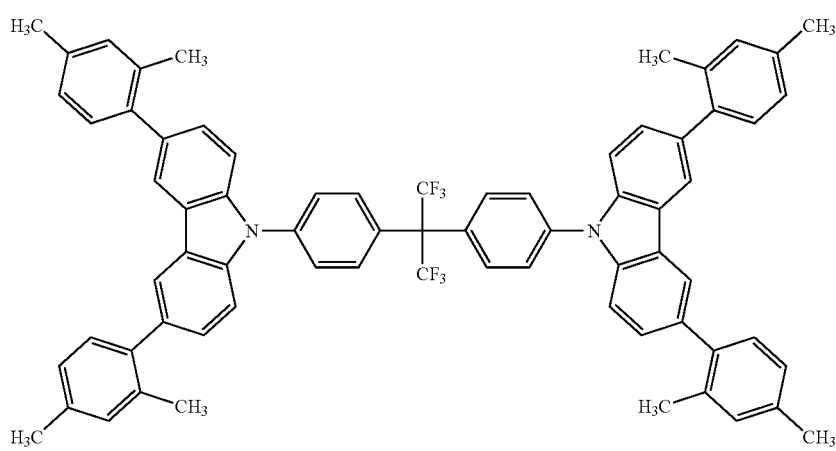
2-30
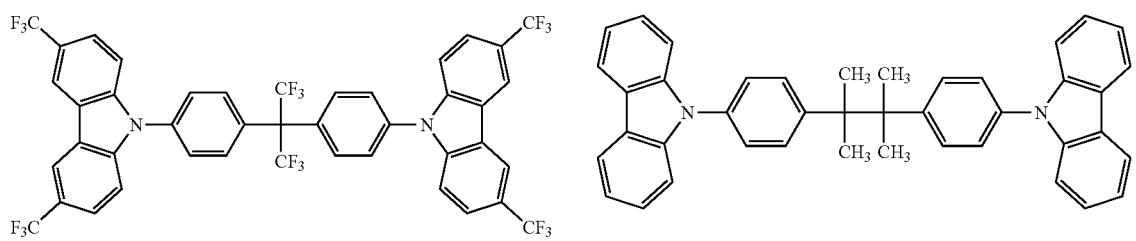
2-31 2-32
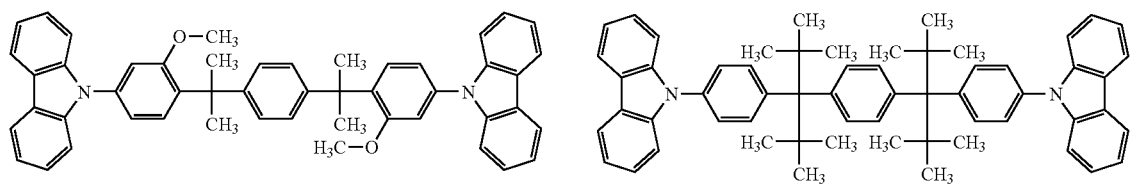
2-33 2-34
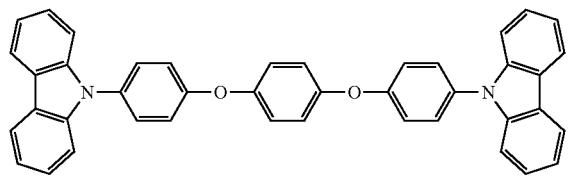
2-35

-continued
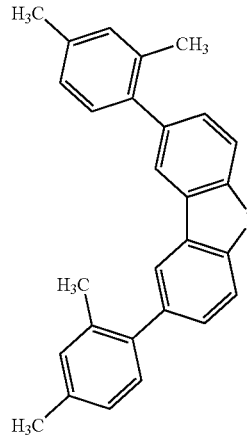
2-36
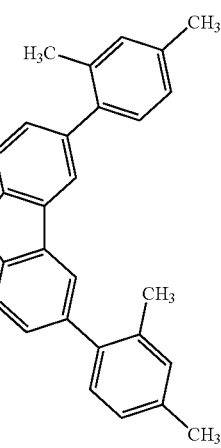
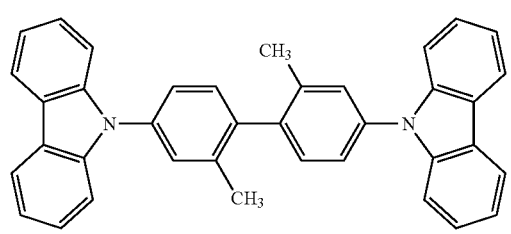
2-37
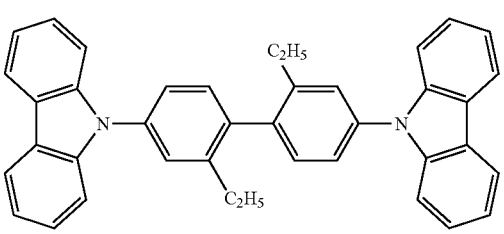
2-38
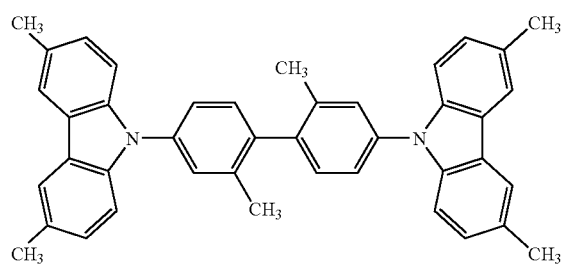
2-39
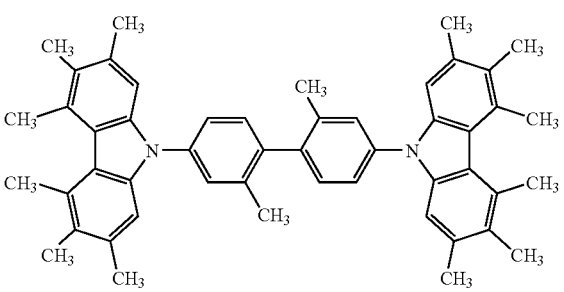
2-40
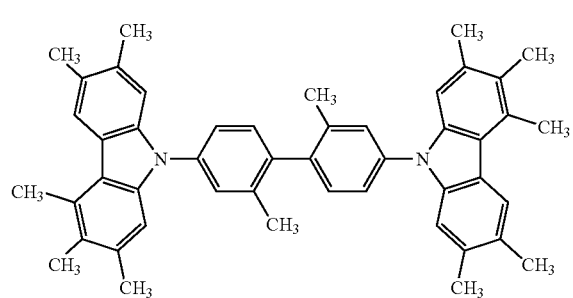
2-41

-continued
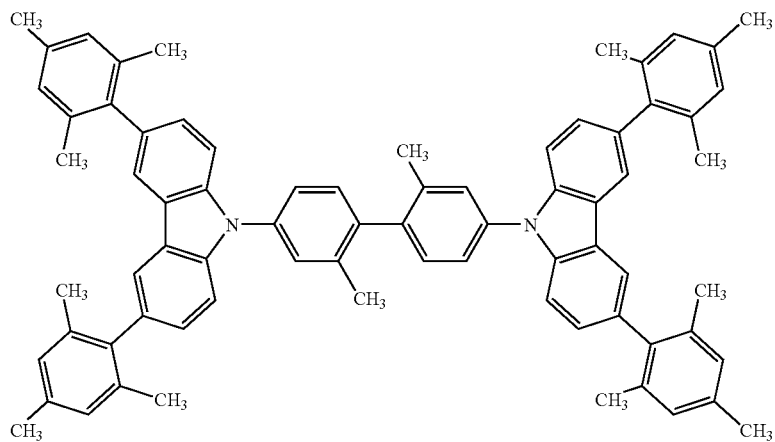
2-42
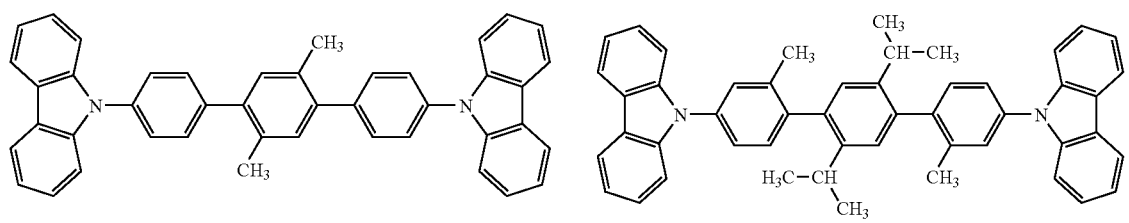
2-43
2-44
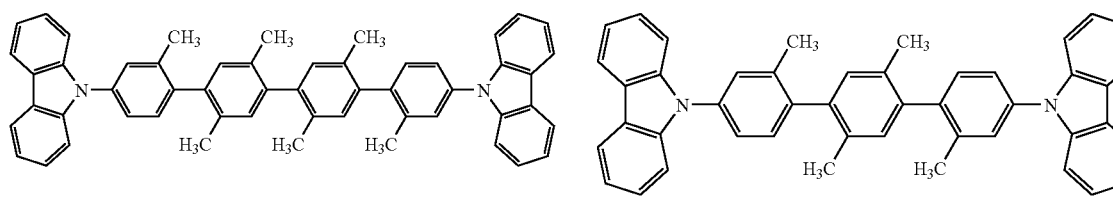
2-45
2-46
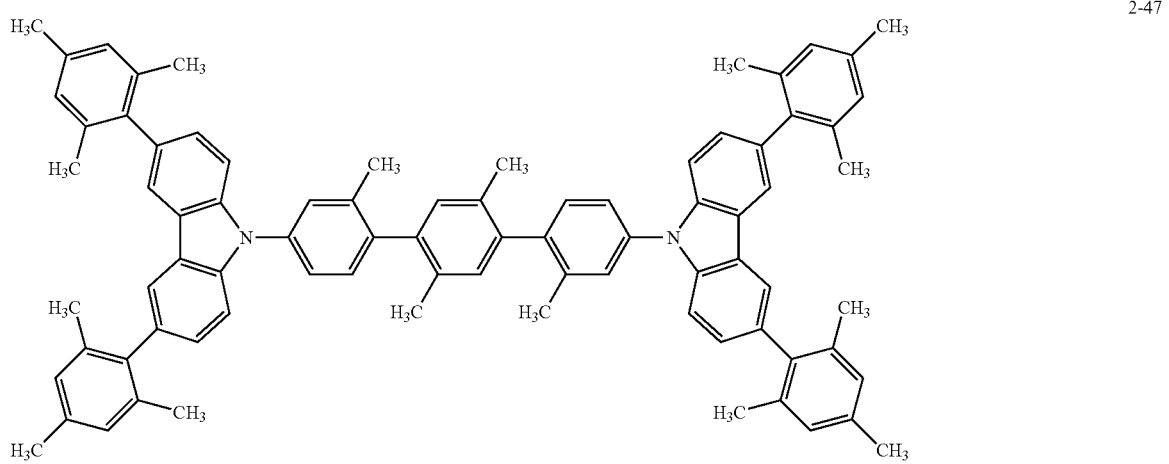
2-47
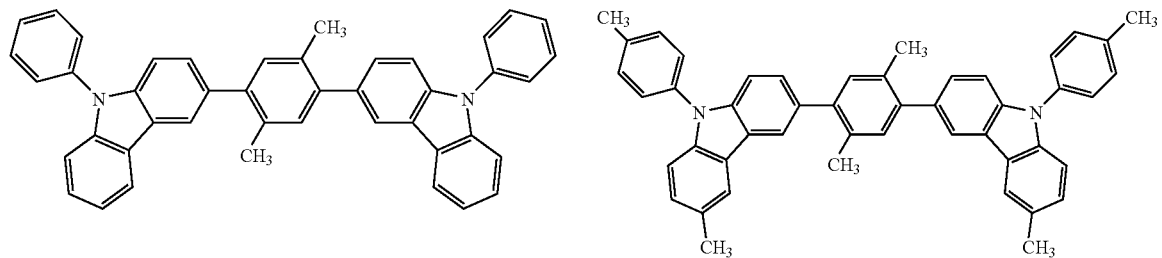
2-48
2-49

-continued

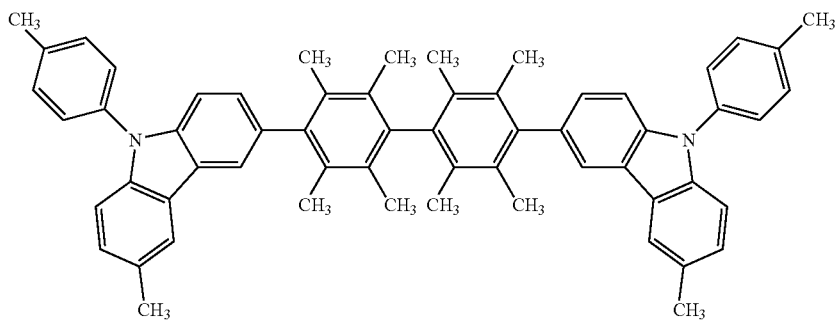

2-50

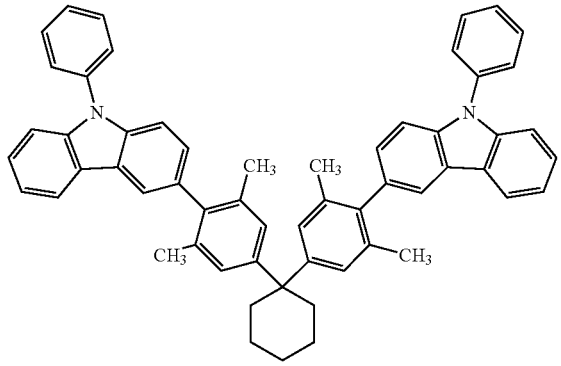

2-51

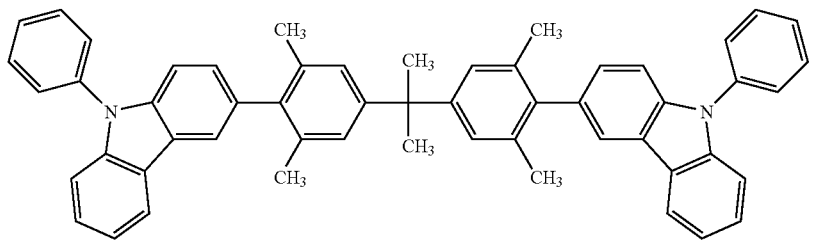

2-52

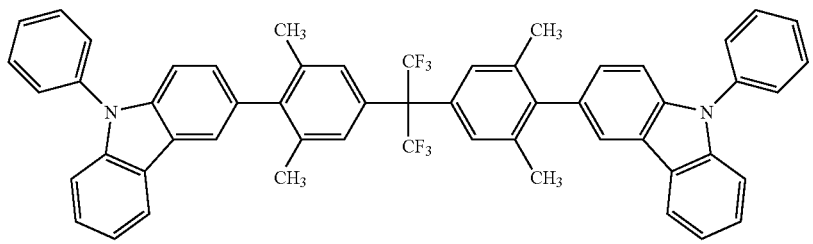

2-53

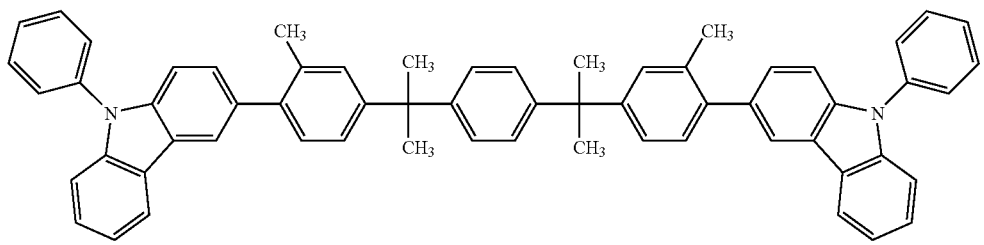

2-54

The light emitting layer may further contain a fluorescent compound having a fluorescence maximum wavelength. In this case, by a energy transfer from other host compound or a phosphorescent compound to a fluorescent compound, light emission from a host compound having a fluorescence maximum wavelength is obtained as the result of electroluminescence of an organic EL element. The host compound having a fluorescence maximum wavelength preferably has a high fluorescence quantum yield in the form of solution. Herein, the fluorescence quantum yield is preferably not less than 10%, and more preferably not less than 30%. Examples of the a host compound having a wavelength providing a fluorescence maximum wavelength include a coumarin dye, a cyanine dye, a chloconium dye, a squalenium dye, an oxobenzanthracene dye, a fluorescene dye, a rhodamine dye, a pyrylium dye, a perylene dye, a stilbene dye, and a polythiophene dye. The fluorescence quantum yield can be measured according to a method described in the fourth edition, Jikken Kagaku Koza 7, Bunko II, p. 362 (1992) published by Maruzen.

Figure 4:
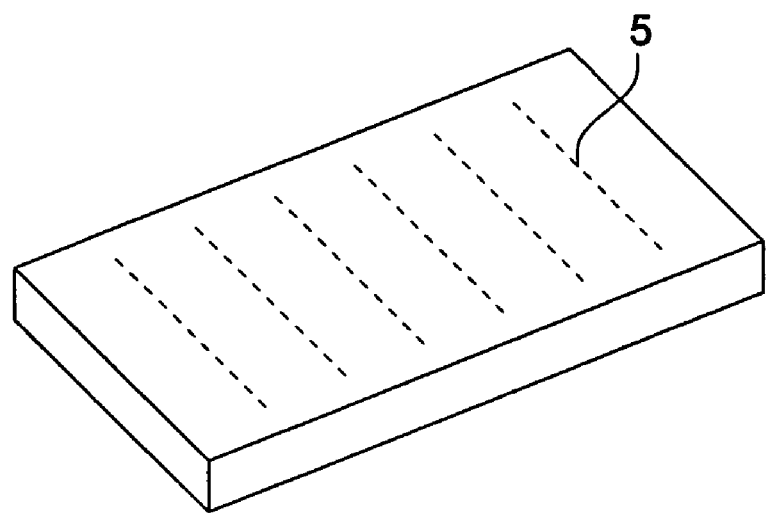
FIG. 4 is a schematic drawing of a display employing a passive matrix method.
Figure 4:
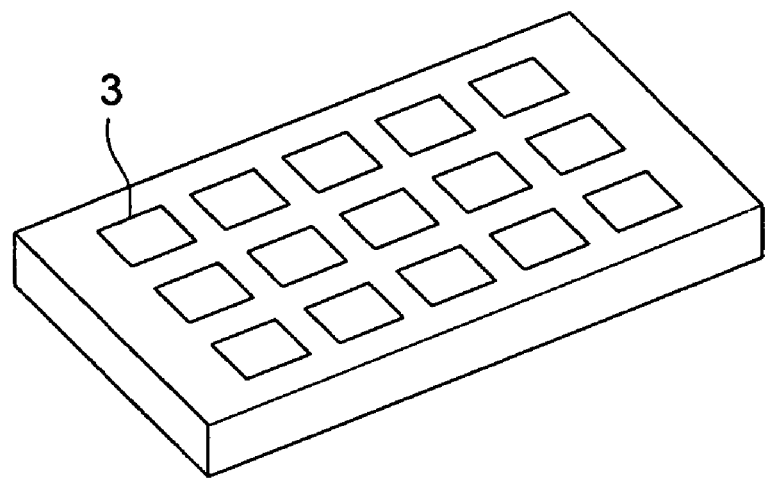
Figure 4:
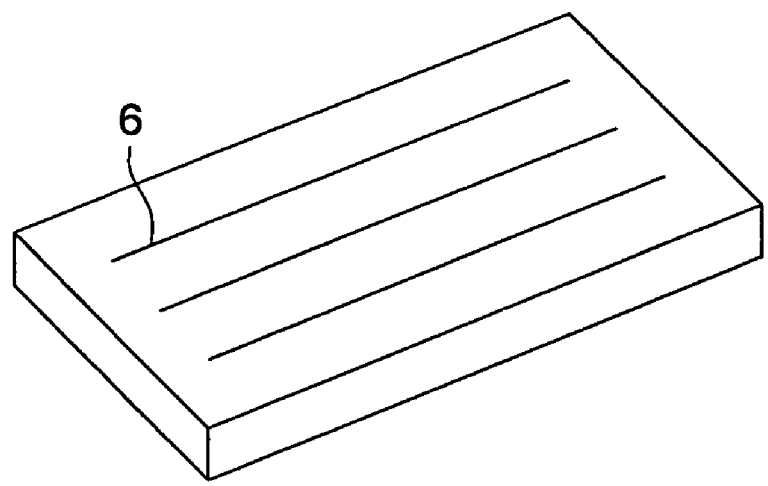

Color of light emitted from the organic EL element or the compound of the present invention is measured by spectroradiometer CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The light emitting layer can be formed employing the above-described compounds applied with a known method such as a vacuum deposition method, a spin coat method, a casting method, an LB method or an ink jet method. The thickness of the light emitting layer is not specifically limited, however, it is ordinarily from 5 nm to 5 μm, and preferably from 5 to 200 nm. The light emitting layer may be composed of a single layer containing one or more of phosphorescent compounds or host compounds, or may be composed of plural layers containing the same composition or different compositions.

<Hole Transport Layer>

The hole transport layer contains a hole transporting material having a hole transport ability. A hole injection layer and an electron blocking layer are included in a hole transport layer in a broad sense. The hole transport layer may either be a single layer or a laminated layer containing a plurality of layers.

"Hole transport material" means a compound having a hole injection ability, a hole transport ability or an electron blocking ability, and it may be an organic substance or an inorganic substance. Examples of a hole transport material include: a triazole derivative, an oxadiazole derivative, an imidazole derivative, a polyarylalkane derivative, a pyrazoline derivative, a pyrazolone derivative, a phenylenediamine derivative, an arylamine derivative, an amino substituted chalcone derivative, an oxazole derivative, a styrylanthracene derivative, a fluorenone derivative, a hydrazone derivative, a stilbene derivative, a silazane derivative, an aniline copolymer, and an electroconductive oligomer, specifically, a thiophene oligomer. As the hole transporting material, those described above are used, however, a porphyrin compound, an aromatic tertiary amine compound and a styrylamine compound are preferable, and, specifically, an aromatic tertiary amine compound is more preferable.

Typical examples of the aromatic tertiary amine compound and styrylamine compound include: N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP-A No. 4-308688 such as 4,4',4"'-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the above mentioned material as the polymer main chain can also be used. As a hole injecting material or a hole transport material, inorganic compounds such as p type-Si and p type-SiC are usable.

The hole transport layer can be formed by preparing a thin layer of the hole transporting material using a known method such as a vacuum deposition method, a spin coat method, a casting method, an ink jet method, and an LB method. The thickness of the hole transport layer is not specifically limited, however, it is ordinarily from 5 nm to 5 μm and preferably 5-200 nm. The hole transport layer may be composed of a single layer structure containing one or more of the materials mentioned above.

<Electron Transport Layer>

The electron transport layer contains a material having an electron transport ability, and in a broad sense an electron injection layer or a hole blocking layer are included in an electron transport layer. The electron transport layer can be provided as a single layer or as a plurality of layers.

The electron transport material is usable when it merely has a function to transport electrons injected at the cathode to the light emitting layer. Such electron transport materials may be optionally selected from known compounds used as electron transport materials, examples of which include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transport material.

A polymer in which the materials mentioned above are introduced in the polymer side chain or a polymer having those materials as the polymer main chain are also applicable.

A metal complex of an 8-quinolynol derivative such as aluminum tris(8-quinolynol)(Alq), aluminum tris(5,7-dichloro-8-quinolynol), aluminum tris(5,7-dibromo-8-quinolynol), aluminum tris(2-methyl-8-quinolynol), aluminum tris(5-methyl-8-quinolynol), or zinc bis(8-quinolynol) (Znq), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emitting layer is preferably employed as the electron transporting material. An inorganic semiconductor such as n-Si and n-SiC may also be used as the electron transporting material in a way similar to the hole transport layer.

The electron transport layer can be formed employing the above described electron transporting materials and a known method such as a vacuum deposition method, a spin coat method, a casting method, a printing method including an ink jet method or an LB method. The thickness of electron transport layer is not specifically limited, however, is ordinarily from 5 nm to 5 µm, and preferably from 5 to 200 nm. The electron transport layer may be composed of a single layer containing one or two or more of the electron transporting material.

<Substrate (Also Referred to as Base Plate, Base or Support)>

The organic EL element of the present invention is preferably provided on a substrate.

The substrate employed for the organic electroluminescent element of the present invention is not restricted to specific kinds of materials such as glass and plastic, as long as it is transparent. Examples of the substrate preferably used include glass, quartz and light transmissible plastic film. Specifically preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP). The surface of the resin film may have a layer of an inorganic or organic compound or a hybrid layer of both compounds.

The external light emission efficiency of the organic electroluminescent element of the present invention is preferably not less than 1%, and more preferably not less than 5% at room temperature. Herein, external: quantum yield (%) is represented by the following formula:

External quantum yield (%)=((the number of photons emitted to the exterior of the organic electroluminescent element)/(the number of electrons supplied to the organic electroluminescent element))×100

A hue improving filter such as a color filter may be used in combination or a color conversion filter which can convert emission light color from an organic EL element to multicolor employing a fluorescent compound may be used in combination. In the case where the color conversion filter is used, the λmax of the light emitted from the organic EL element is preferably not more than 480 nm.

<Preparation of Organic EL Element>

For one example, the preparation of the organic EL element, which has the following constitution will be described: Anode/Anode buffer layer/Hole transport layer/Electron blocking layer 2/Electron blocking layer 1/Light emitting layer/Hole blocking layer 1/Hole blocking layer 2/Electron transport layer/Cathode buffer layer/Cathode A thin layer of a desired material for an electrode such as a material of the anode is formed on a suitable substrate by a vacuum deposition or sputtering method to prepare the anode so that the thickness of the layer is not more than 1 µm and preferably within the range of from 10 to 200 nm. Then organic compound thin layers including the anode buffer layer, the hole transport layer, electron blocking layer 2, electron blocking layer 1, the light emitting layer, hole blocking layer 1, hole blocking layer 2, the electron transport layer, and the cathode buffer layer, which constitute the organic EL element, are formed on the resulting anode in that order.

As methods for formation of the thin layers, as the same as described above, there are a vacuum deposition method and a wet process (for example, a spin coating method, a casting method, an ink jet method, and a printing method), however, a vacuum deposition method, a spin coating method, an ink jet method and a printing method are preferably used, since a uniform layer without a pinhole can be formed. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from −50 to 300° C. to form a layer with a thickness of from 0.1 nm to 5 µm, preferably from 5 to 200 nm.

After these layers has been formed, a thin layer of a material for a cathode is formed thereon to prepare a cathode, employing, for example, a deposition method or sputtering method to give a thickness of not more than 1 µm, and preferably from 50 to 200 nm. Thus, a desired organic EL element is obtained. It is preferred that the layers from the hole injection layer to the cathode are continuously formed under one time of vacuuming to obtain an organic EL element. However, on the way of the layer formation under vacuum, a different layer formation method by taking the layer out of the vacuum chamber may be inserted. When the different method is used, the process is required to be carried out under a dry inert gas atmosphere.

In the multicolor display of the present invention, the light emitting layer only is formed using a shadow mask, and the other layers, besides the light emitting layer, are formed employing a vacuum method, a casting method, a spin coating method, an ink-jetting method or a printing method in which patterning employing the shadow mask is not required.

When the light emitting layer only is formed by patterning, the layer formation, although not specifically limited, is carried out preferably according to a vacuum deposition method, an ink jet method or a printing method. When a vacuum deposition method is used as the layer formation method, patterning of the layer is preferably carried out employing a shadow mask.

Further, the organic EL element can be prepared in the reverse order. When a direct current voltage, a voltage of 2 to 40 V is applied to thus obtained multicolor display, setting the anode as a + polarity and the cathode as a − polarity, light emission occurs. An alternating current may also be applied to cause light emission. Arbitrary wave shape of alternating current may be used.

The display of the present invention can be used as a display device, a display, or various light emission sources. The display device or the display, which employs three kinds of organic EL elements emitting a blue light, a red light and a green light can present a full color image.

Examples of the display device or the display include a television, a personal computer, a mobile device or an AV device, a display for text broadcasting, and an information display used in a car. The display device may be used as specifically a display for reproducing a still image or a moving image. When the display device is used as a display for reproducing a moving image, the driving method may be either a simple matrix (passive matrix) method or an active matrix method.

Examples of an illuminator include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, however, are not limited thereto.

The organic EL element of the present invention may be an organic EL element having a resonator structure.

The organic EL element having a resonator structure is applied to a light source for a photo-memory medium, a light source for an electrophotographic copier, a light source for an optical communication instrument, or a light source for a photo-sensor, however, its application is not limited thereto. In the above application, a laser oscillation may be carried out.

<Display>

The organic EL element of the present invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image by employing two or more kinds of organic EL elements each emitting light with a different color. A monochromatic color, for example, a white color can be converted to a full color of BGR, employing a color filter. Further, employing a color conversion filter, light color emitted from the organic EL element can be converted to another color or full color, where the λmax of the light emitted from the organic EL element is preferably not more than 480 nm.

One of the examples of the display containing the organic EL element of the present invention will be explained below employing figures.

FIG. 1 is a schematic drawing of one example of a display containing an organic EL element. FIG. 1 is a display such as that of a cellular phone, displaying image information due to light emission from the organic EL.

Display 1 contains display section A having plural pixels and control section B carrying out image scanning based on image information to display an image in display section A.

Control section B is electrically connected to display section A, transmits a scanning signal and an image data signal to each of the plural pixels based on image information from the exterior, and conducts image scanning which emits light from each pixel due to the scanning signal according to the image data signal, whereby an image is displayed on display section A.

Figure 2:
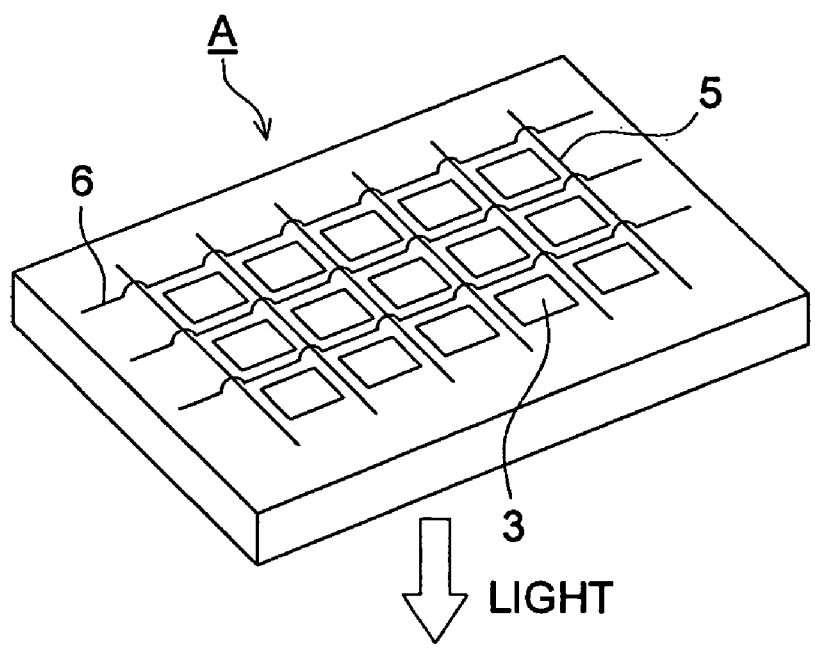
FIG. 2 is a schematic drawing of a display section.

FIG. 2 is a schematic drawing of display section A. Display section A contains a substrate, plural pixels 3, and a wiring section containing plural scanning lines 5 and plural data lines 6. The main members of display section A will be explained below. In FIG. 2, light from pixels 3 is emitted in the direction of an arrow.

Plural scanning lines 5 and plural data lines 6 of wiring section 2 each are composed of an electroconductive material, lines 5 and lines 6 being crossed with each other at a right angle, and connected with pixels 3 at the crossed points (not illustrated).

Plural pixels 3, when the scanning signal is applied from scanning lines 5, receive the data signal from data lines 6, and emit light corresponding to the image data received. Provision of red light emitting pixels, green light emitting pixels, and blue light emitting pixels side by side on the same substrate can display a full color image.

Next, an emission process of pixels will be explained.

Figure 3:
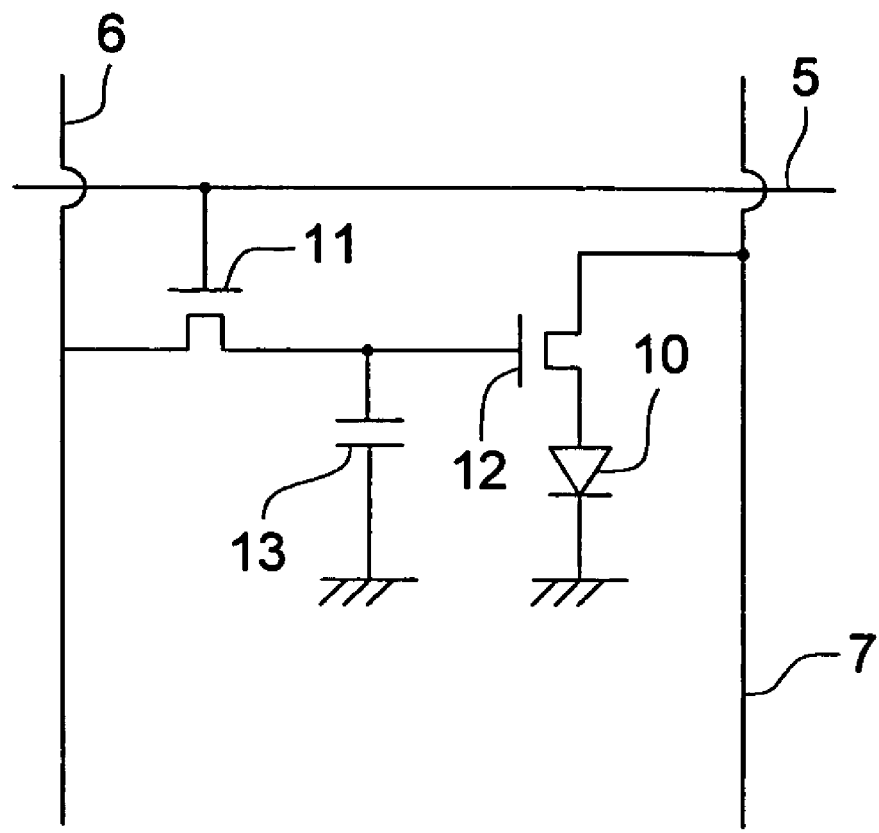
FIG. 3 is a schematic drawing of a pixel.

FIG. 3 is a schematic drawing of a pixel.

The pixel contains organic EL element 10, switching transistor 11, driving transistor 12, and capacitor 13. When a pixel with a red light emitting organic EL element, a pixel with a green light emitting organic EL element, and a pixel with a blue light emitting organic EL element are provided side by side on the same substrate, a full color image can be displayed.

In FIG. 3, an image data signal is applied through data lines 6 from control section B to a drain of switching transistor 11, and when a scanning signal is applied to a gate of switching transistor 11 through scanning lines 5 from control section B, switching transistor 11 is switched on, and the image signal data applied to the drain is transmitted to capacitor 13 and the gate of driving transistor 12.

Capacitor 13 is charged according to the electric potential of the image data signal transmitted, and driving transistor 12 is switched on. In driving transistor 12, the drain is connected to electric source line 7, and the source to organic EL element 10. Current is supplied from electric source line 7 to organic EL element 10 according to the electric potential of the image data signal applied to the gate.

The scanning signal is transmitted to next scanning line 5 according to the successive scanning of control section B, switching transistor 11 is switched off. Even if switching transistor 11 is switched off, driving transistor 12 is turned on since capacitor 13 maintains a charged potential of image data signal, and light emission from organic EL element 10 continues until the next scanning signal is applied. When the next scanning signal is applied according the successive scanning, driving transistor 12 works according to an electric potential of the next image data signal synchronized with the scanning signal, and light is emitted from organic EL element 10.

That is, light is emitted from organic EL element 10 in each of plural pixels 3 due to switching transistor 11 as an active element and driving transistor 12 each being provided in organic EL element 10 of each of plural pixels 3. This emission process is called an active matrix process.

Herein, light emission from organic EL element 10 may be emission with plural gradations according to image signal data of multiple value having plural gradation potentials, or emission due to on-off according to a binary value of the image data signals.

The electric potential of capacitor 13 may maintain till the next application of the scanning signal, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

FIG. 4 is a schematic drawing of a display employing a passive matrix method. In FIG. 4, pixels 3 are provided between scanning lines 5 and data lines 6, crossing with each other.

When scanning signal is applied to scanning line 5 according to successive scanning, pixel 3 connecting scanning line 5 emits according to the image data signal. The passive matrix method has no active element in pixel 3, which reduces manufacturing cost of a display.

EXAMPLES

The present invention will now be explained using the examples, however, the present invention is not limited thereto.

Example 1

Preparation of Organic EL Elements 1-1 to 1-10

(1) Preparation of Organic EL Element 1-1

A pattern was formed on a substrate (100 mm×100 mm×1.1 mm) composed of a glass plate and a 100 nm ITO (indium tin oxide) layer (NA45 manufactured by NH Technoglass. Co., Ltd.) as an anode. Then the resulting transparent substrate having the ITO transparent electrode was subjected to ultrasonic washing in i-propyl alcohol and dried with a dry nitrogen gas and subjected to UV-ozone cleaning for 5 minutes. Thus obtained transparent substrate was fixed on a substrate holder of a vacuum deposition apparatus available on the market. Further, 200 mg of NPD was placed in a resistive heating molybdenum boat, 200 mg of CBP was put in another resistive heating molybdenum boat, 200 mg of Ir-1 was placed in another resistive heating molybdenum boat, 200 mg of bathocuproine (BCP) was placed in another resistive heating molybdenum boat, and 200 mg of Alq$_3$ was placed in another resistive heating molybdenum boat, and then fixed in the vacuum deposition apparatus.

The pressure in the vacuum tank was reduced to 4×10$^{-4}$ Pa. Then, the boat carrying NPD was heated by supplying an electric current to the boat, and NPD was deposited onto the transparent substrate at a depositing speed of 0.1 nm/sec to form a 45 nm thick hole transport layer. After that, the boat carrying CBP and the boat carrying Ir-1 were heated by supplying an electric current to both boats, and CBP at a depositing speed of 0.1 nm/sec and Ir-1 at a depositing speed of 0.006 nm/sec were co-deposited onto the resulting hole transport layer to form a light emitting layer with a thickness of 30 nm.

Subsequently, the boat carrying BCP and the boat carrying Ir-1 were heated by supplying an electric current to the boats, and BCP at a depositing speed of 0.2 nm/sec and Ir-1 at a depositing speed of 0.0001 nm/sec were co-deposited onto the resulting light emitting layer to form hole blocking layer 1 with a thickness of 20 nm.

Further, the boat carrying Alq$_3$ was heated by supplying an electric current to the boat, and Alq$_3$ was deposited onto the resulting hole blocking layer 1 at a depositing speed of 0.1 nm/sec to form an electron transport layer with a thickness of 30 nm. The temperature of the substrate at the time of the deposition was room temperature.

After that, a 0.5 nm thick lithium fluoride layer as a cathode buffer layer and a 110 nm thick aluminum layer as a cathode were deposited. Thus, Organic EL Element 1-1 was prepared.

(2) Preparation of Organic EL Element 1-2

Organic EL Element 1-2 was prepared in the same manner as Organic EL Element 1-1 except that only BCP was deposited without using Ir-1 to form hole blocking layer 1 (with a deposition speed: 0.2 nm/sec and a thickness: 20 nm).

(3) Preparation of Organic EL Element 1-3

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol and dried with a dry nitrogen gas and subjected to UV-ozone cleaning for 5 minutes. Thus obtained transparent substrate was fixed on a substrate holder of a vacuum deposition apparatus available on the market. Further, 200 mg of NPD was placed in a resistive heating molybdenum boat, 200 mg of compound 1 was placed in another resistive heating molybdenum boat, 200 mg of compound 2 was placed in another resistive heating molybdenum boat, 100 mg of Ir-12 was placed in another resistive heating molybdenum boat, 200 mg of compound 3 was placed in another resistive heating molybdenum boat, and 200 mg of Alq$_3$ was placed in another resistive heating molybdenum boat, and then fixed in the vacuum deposition apparatus.

The pressure in the vacuum tank was reduced to 4×10$^{-4}$ Pa. Then, the boat carrying NPD was heated by supplying an electric current to the boat, and NPD was deposited onto the transparent substrate at a depositing speed of 0.1 nm/sec to form a 25 nm thick hole transport layer.

After that, the boat carrying compound 1 and the boat carrying Ir-12 were heated by supplying an electric current to both boats, and compound 1 at a depositing speed of 0.2 nm/sec and Ir-12 at a depositing speed of 0.0004 nm/sec were co-deposited onto the resulting hole transport layer to form electron blocking layer 1 with a thickness of 20 nm.

Subsequently, the boat carrying compound 2 and the boat carrying Ir-12 were heated by supplying an electric current to the boats, and compound 2 at a depositing speed of 0.1 nm/sec and Ir-12 at a depositing speed of 0.006 nm/sec were co-deposited onto the resulting electron blocking layer 1 to form a light emitting layer with a thickness of 30 nm.

Then, the boat carrying compound 3 and the boat carrying Ir-12 were heated by supplying an electric current to the boats, and compound 3 at a depositing speed of 0.2 nm/sec and Ir-12 at a depositing speed of 0.0001 nm/sec were co-deposited onto the resulting light emitting layer to form a hole blocking layer 1 with a thickness of 20 nm.

Further, the boat carrying Alq$_3$ was heated by supplying an electric current to the boat, and Alq$_3$ was deposited onto the resulting hole blocking layer 1 at a depositing speed of 0.1 nm/sec to form an electron transport layer with a thickness of 30 nm. The temperature of the substrate at the time of the deposition was room temperature.

After that, a 0.5 nm thick lithium fluoride layer as a cathode buffer layer and a 110 nm thick aluminum layer as a cathode were deposited. Thus, Organic EL Element 1-3 was prepared.

(4) Preparation of Organic EL Element 1-4

A pattern was formed on a substrate (100 mm×10.0 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol and dried with a dry nitrogen gas and subjected to UV-ozone cleaning for 5 minutes. Thus obtained transparent substrate was fixed on a substrate holder of a vacuum deposition apparatus available on the market. Further, 200 mg of NPD was placed in a resistive heating molybdenum boat, 200 mg of compound 1 was placed in another resistive heating molybdenum boat, 200 mg of compound 2 was placed in another resistive heating molybdenum boat, 100 mg of Ir-12 was placed in another resistive heating molybdenum boat, 200 mg of compound 3 was placed in another resistive heating molybdenum boat, and 200 mg of Alq$_3$ was placed in another resistive heating molybdenum boat, and then fixed in the vacuum deposition apparatus.

The pressure in the vacuum tank was reduced to 4×10$^{-4}$ Pa. Then, the boat carrying NPD was heated by supplying an electric current to the boat, and NPD was deposited onto the transparent substrate at a depositing speed of 0.1 nm/sec to form a 25 nm thick hole transport layer.

After that, the boat carrying Compound 1 was heated by supplying an electric current to the boat, and Compound 1 was deposited at a depositing speed of 0.1 nm/sec onto the resulting hole transport layer to form electron blocking layer 2 with a thickness of 10 nm.

Subsequently, the boat carrying Compound 1 and the boat carrying Ir-12 were heated by supplying an electric current to the boats, and compound 1 at a depositing speed of 0.2 nm/sec and Ir-12 at a depositing speed of 0.0004 nm/sec were co-deposited onto the resulting electron blocking layer 2 to form electron blocking layer 1 with a thickness of 10 nm.

Then, the boat carrying compound 2 and the boat carrying Ir-12 were heated by supplying an electric current to the boats, and compound 2 at a depositing speed of 0.1 nm/sec and Ir-12 at a depositing speed of 0.006 nm/sec were co-deposited onto the resulting electron blocking layer 1 to form a light emitting layer with a thickness of 30 nm.

Then, the boat carrying compound 3 and the boat carrying Ir-12 were heated by supplying an electric current to the boats, and compound 3 at a depositing speed of 0.2 nm/sec and Ir-12 at a depositing speed of 0.0001 nm/sec were co-deposited onto the resulting light emitting layer to form hole blocking layer 1 with a thickness of 10 nm.

After that, the boat carrying compound 3 was heated by supplying an electric current to the boat, and compound 3 was deposited onto the resulting hole blocking layer 1 to form hole blocking layer 2 with a thickness of 10 nm.

Then, the boat carrying $Alq_3$ was heated by supplying an electric current to the boat, and $Alq_3$ was deposited onto the resulting hole blocking layer 2 at a depositing speed of 0.1 nm/sec to form an electron transport layer with a thickness of 30 nm. The temperature of the substrate at the time of the deposition was room temperature.

After that, a 0.5 nm thick lithium fluoride layer as a cathode buffer layer and a 110 nm thick aluminum layer as a cathode were deposited. Thus, Organic EL Element 1-4 was prepared.

(5) Preparation of Organic EL Element 1-5

Organic EL Element 1-5 was prepared in the same manner as Organic EL Element 1-3 except that only compound 1 was deposited without using Ir-12 to form electron blocking layer 1 (with a deposition speed: 0.2 nm/sec and a thickness: 20 nm), and that only compound 3 was deposited without using Ir-12 to form hole blocking layer 1 (with a deposition speed: 0.2 nm/sec and a thickness: 20 nm).

(6) Preparation of Organic EL Element 1-6

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol and dried with a dry nitrogen gas and subjected to UV-ozone cleaning for 5 minutes. Thus obtained transparent substrate was fixed on a substrate holder of a vacuum deposition apparatus available on the market. Further, 200 mg of NPD was placed in a resistive heating molybdenum boat, 200 mg of compound 1 was placed in another resistive heating molybdenum boat, 200 mg of compound 2 was placed in another resistive heating molybdenum boat, 100 mg of Ir-1 was placed in another resistive heating molybdenum boat, 100 mg of Ir-12 was placed in another resistive heating molybdenum boat, 100 mg of Ir-7 was placed in another resistive heating molybdenum boat, 200 mg of compound 3 was placed in another resistive heating molybdenum boat, and 200 mg of $Alq_3$ was placed in another resistive heating molybdenum boat, and then fixed in the vacuum deposition apparatus.

The pressure in the vacuum tank was reduced to $4\times10^{-4}$ Pa. Then, the boat carrying NPD was heated by supplying an electric current to the boat, and NPD was deposited onto the transparent substrate at a depositing speed of 0.1 nm/sec to form a 25 nm thick hole transport layer.

After that, the boat carrying compound 1 was heated by supplying an electric current to the boat, and compound 1 was deposited at a depositing speed of 0.1 nm/sec onto the resulting hole transport layer to form electron blocking layer 2 with a thickness of 10 nm.

Subsequently, the boat carrying compound 1 and the boat carrying Ir-12 were heated by supplying an electric current to the boats, and compound 1 at a depositing speed of 0.1 nm/sec and Ir-12 at a depositing speed of 0.0006 nm/sec were co-deposited onto the resulting electron-blocking layer 2 to form electron blocking layer 1 with a thickness of 10 nm.

Then, the boat carrying compound 2 and the boat carrying Ir-1 were heated by supplying an electric current to the boats, and compound 2 at a depositing speed of 0.1 nm/sec and Ir-12 at a depositing speed of 0.006 nm/sec were co-deposited onto the resulting electron blocking layer 1 to form a light emitting layer with a thickness of 30 nm.

Then, the boat carrying compound 3 and the boat carrying Ir-7 were heated by supplying an electric current to the boats, and compound 3 at a depositing speed of 0.1 nm/sec and Ir-7 at a depositing speed of 0.0003 nm/sec were co-deposited onto the resulting light emitting layer to form hole blocking layer 1 with a thickness of 10 nm.

After that, the boat carrying compound 3 was heated by supplying an electric current to the boat, and compound 3 was deposited onto the resulting hole blocking layer 1 to form hole blocking layer 2 with a thickness of 10 nm.

Then, the boat carrying $Alq_3$ was heated by supplying an electric current to the boat, and $Alq_3$ was deposited onto the resulting hole blocking layer 2 at a depositing speed of 0.1 nm/sec to form an electron transport layer with a thickness of 30 nm. The temperature of the substrate at the time of the deposition was room temperature.

After that, a 0.5 nm thick lithium fluoride layer as a cathode buffer layer and a 110 nm thick aluminum layer as a cathode were deposited. Thus, Organic EL Element 1-6 was prepared.

(7) Preparation of Organic EL Element 1-7

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol and dried with a dry nitrogen gas and subjected to UV-ozone cleaning for 5 minutes. Thus obtained transparent substrate was fixed on a substrate holder of a vacuum deposition apparatus available on the market. Further, 200 mg of NPD was placed in a resistive heating molybdenum boat, 200 mg of compound 1 was placed in another resistive heating molybdenum boat, 200 mg of compound 2 was placed in another resistive heating molybdenum boat, 100 mg of Ir-1 was placed in another resistive heating molybdenum boat, 100 mg of Ir-12 was placed in another resistive heating molybdenum boat, 100 mg of Ir-7 was placed in another resistive heating molybdenum boat, 200 mg of compound 3 was placed in another resistive heating molybdenum boat, and 200 mg of $Alq_3$ was placed in another resistive heating molybdenum boat, and then fixed in the vacuum deposition apparatus.

The pressure in the vacuum tank was reduced to $4\times10^{-4}$ Pa. Then, the boat carrying NPD was heated by supplying an electric current to the boat, and NPD was deposited onto the transparent substrate at a depositing speed of 0.1 nm/sec to form a 25 nm thick hole transport layer.

After that, the boat carrying compound 1 was heated by supplying an electric current to the boat, and compound 1 was deposited at a depositing speed of 0.1 nm/sec onto the resulting hole transport layer to form electron blocking layer 1 with a thickness of 20 nm.

Subsequently, the boat carrying compound 2, the boat carrying Ir-1 and the boat carrying Ir-12 were heated by supplying an electric current to the boats, and compound 2 at a depositing speed of 0.1 nm/sec, Ir-1 at a depositing speed of 0.004 nm/sec, and Ir-12 at a depositing speed of 0.003 nm/sec were co-deposited onto the resulting electron blocking layer 1 to form a light emitting layer with a thickness of 30 nm.

Then, the boat carrying compound 3 and the boat carrying Ir-7 were heated by supplying an electric current to the boats, and compound 3 at a depositing speed of 0.1 nm/sec and Ir-7 at a depositing speed of 0.0003 nm/sec were co-deposited onto the resulting light emitting layer to form hole blocking layer 1 with a thickness of 10 nm.

After that, the boat carrying compound 3 was heated by supplying an electric current to the boat, and compound 3 was deposited onto the resulting hole blocking layer 1 to form hole blocking layer 2 with a thickness of 10 nm.

Then, the boat carrying $Alq_3$ was heated by supplying an electric current to the boat, and $Alq_3$ was deposited onto the resulting hole blocking, layer 2 at a depositing speed of 0.1 nm/sec to form an electron transport layer with a thickness of 30 nm. The temperature of the substrate at the time of, the deposition was room temperature.

After that, a 0.5 nm thick lithium fluoride layer as a cathode buffer layer and a 110 nm thick aluminum layer as a cathode were deposited. Thus, Organic EL Element 1-7 was prepared.

(8) Preparation of Organic EL Element 1-8

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol and dried with a dry nitrogen gas and subjected to UV-ozone cleaning for 5 minutes. Thus obtained transparent substrate was fixed on a substrate holder of a vacuum deposition apparatus available on the market. Further, 200 mg of NPD was placed in a resistive heating molybdenum boat, 200 mg of compound 1 was placed in another resistive heating molybdenum boat 200 mg of compound 2 was placed in another resistive heating molybdenum boat, 100 mg of Ir-1 was placed in another resistive heating molybdenum boat, 100 mg of Ir-12 was placed in another resistive heating molybdenum boat, 100 mg of Ir-7 was placed in another resistive heating molybdenum boat, 200 mg of compound 3 was placed in another resistive heating molybdenum boat, and 200 mg of $Alq_3$ was placed in another resistive heating molybdenum boat, and then fixed in the vacuum deposition apparatus.

The pressure in the vacuum tank was reduced to $4 \times 10^{-4}$ Pa. Then, the boat carrying NPD was heated by supplying an electric current to the boat, and NPD was deposited onto the transparent substrate at a depositing speed of 0.1 nm/sec to form a 25 nm thick hole transport layer.

After that, the boat carrying compound 1 was heated by supplying an electric current to the boat, and compound 1 was deposited at a depositing speed of 0.1 nm/sec onto the resulting hole transport layer to form electron blocking layer 1 with a thickness of 20 nm.

Subsequently, the boat carrying compound 2, the boat carrying Ir-1, the boat carrying Ir-7, and the boat carrying Ir-12 were heated by supplying an electric current to the boats, and compound 2 at a depositing speed of 0.1 nm/sec, Ir-1 at a depositing speed of 0.004 nm/sec, Ir-7 at a depositing speed of 0.003 nm/sec, and Ir-12 at a depositing speed of 0.002 nm/sec were co-deposited onto the resulting electron blocking layer 1 to form a light emitting layer with a thickness of 30 nm.

After that, the boat carrying compound 3 was heated by supplying an electric current to the boat, and compound 3 was deposited at a depositing speed of 0.1 nm/sec onto the light emitting layer to form hole blocking layer 1 with a thickness of 10 nm.

After that, the boat carrying compound 3 was heated by supplying an electric current to the boat, and compound 3 was deposited onto the resulting hole blocking layer 1 to form hole blocking layer 2 with a thickness of 10 nm.

Then, the boat carrying $Alq_3$ was heated by supplying an electric current to the boat, and $Alq_3$ was deposited onto the resulting hole blocking layer 2 at a depositing speed of 0.1 nm/sec to form an electron transport layer with a thickness of 30 nm. The temperature of the substrate at the time of the deposition was room temperature.

After that, a 0.5 nm thick lithium fluoride layer as a cathode buffer layer and a 110 nm thick aluminum layer as a cathode were deposited. Thus, organic EL Element 1-8 was prepared.

(9) Preparation of Organic EL Element 1-9
Construction of the element:
ITO/NPD/CBP:rubrene/BCP:rubrene/$Alq_3$/LiF/Al
Preparation method is the same as that of Organic EL Element 1-1, wherein the dopant is rubrene which is a fluorescent dopant.

(10) Preparation of Organic EL Element 1-10
Construction of the element:
ITO/NPD/CBP:rubrene/BCP/$Alq_3$/LiF/Al
An example of Organic EL Element 1-9, in which rubrene is not used in the hole blocking layer.
Preparation method is the same as that of Organic EL Element 1-2, wherein the dopant of the light emitting layer is rubrene which is a fluorescent dopant.
Preparation method is the same as that of Organic EL Element 1-2, wherein the dopant is rubrene which is a fluorescent dopant.

With respect to prepared Organic EL Element 1-1 to 1-10, the data on color of emitted light; the content of the phosphorescent compound in hole blocking layer 1, electron blocking layer 1 and the light emitting layer; the content of the phosphorescent compound in each layer; and related emission, are summarized in Table 1.

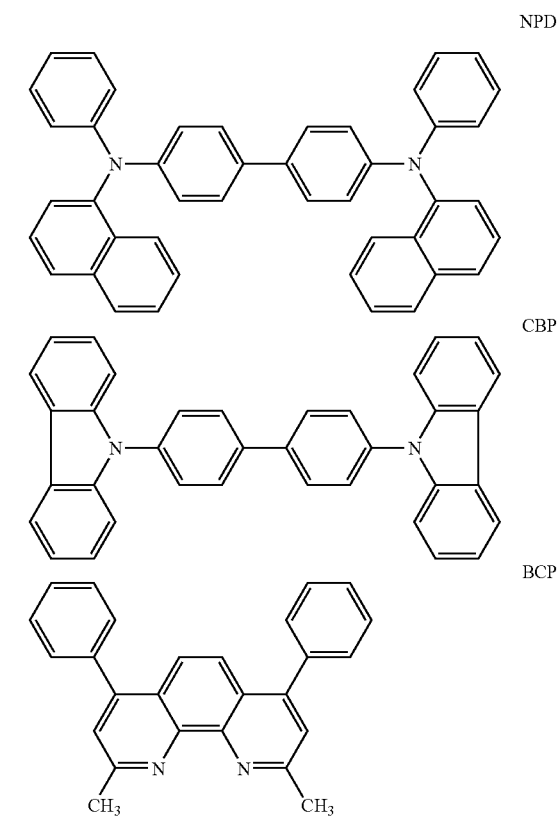

-continued

Alq3

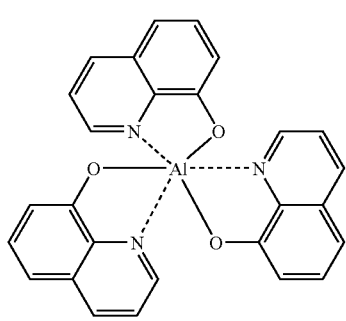

Compound 1

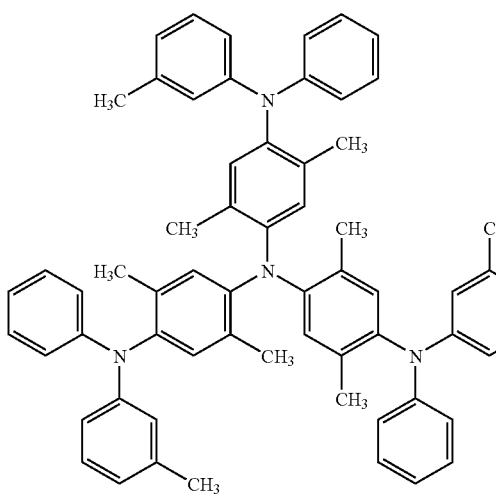

Compound 2

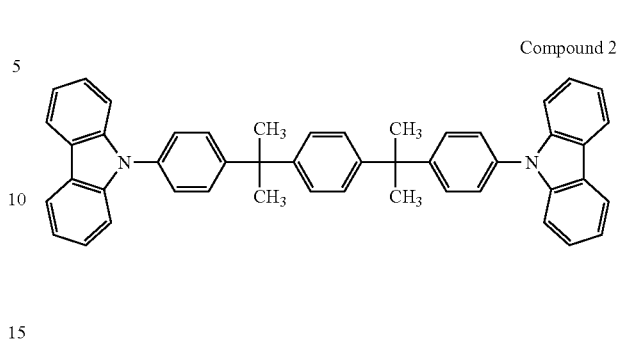

Compound 3

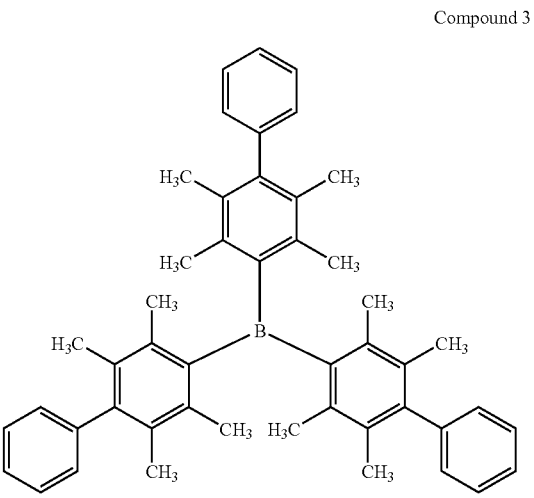

TABLE 1

| Organic EL Element | Color of Emitted Light | Content A of Phosphorescent or Fluorescent Compound in Light Emission Layer (% by weight) | Content B of Phosphorescent or Fluorescent Compound in Hole Blocking Layer 1 (% by weight) | Content C of Phosphorescent or Fluorescent Compound in Electron Blocking Layer (% by weight) | B/A × 100 (%) | C/A × 100 (%) | *1 | *2 | Remarks |
|---|---|---|---|---|---|---|---|---|---|
| 1-1 | Green | 6 | 0.05 | 0 | 0.83333 | 0 | 1.2 | 0 | Inv. |
| 1-2 | Green | 6 | 0 | 0 | 0 | 0 | 0 | 0 | Comp. |
| 1-3 | Blue | 6 | 0.2 | 0.05 | 3.33333 | 0.8333 | 2.5 | 0.3 | Inv. |
| 1-4 | Blue | 6 | 0.2 | 0.05 | 3.33333 | 0.8333 | 2.5 | 0.3 | Inv. |
| 1-5 | Blue | 6 | 0 | 0 | 0 | 0 | 0 | 0 | Comp. |
| 1-6 | White | 6 | 0.6 | 0.3 | 10 | 5 | 30 | 11 | Inv. |
| 1-7 | White | 7 | 0.3 | 0 | 4.28571 | 0 | 36 | 0 | Inv. |
| 1-8 | White | 9 | 0 | 0 | 0 | 0 | 0 | 0 | Comp. |
| 1-9 | Yellow | 6 | 0.05 | 0 | 0.83333 | 0 | 1.2 | 0 | Comp. |
| 1-10 | Yellow | 6 | 0 | 0 | 0 | 0 | 0 | 0 | Comp. |

*1: (Amount of phosphorescent emission in hole blocking layer 1)/(Amount of phosphorescent emission in light emission layer) × 100
*2: (Amount of phosphorescent emission in electron blocking layer 1)/(Amount of phosphorescent emission in light emission layer) × 100
Inv.: Inventive, Comp.: Comparative <Evaluation of Organic EL Elements 1-1 to 1-10>

Organic EL Elements 1-1 to 1-10 obtained as above were evaluated as follows, and the results were shown in Table 1.

(Emission Life)

A period in which an initial emission intensity of an organic EL element decreased to half of it was defined as a half-life period (τ0.5) and used as an index of the life of an organic EL element, the emission intensity being measured by supplying a constant electric current of 2.5 mA/cm² at 23° C. in a dry nitrogen atmosphere. A spectroradiometer CS-1000 produced by Minolta Inc. was used for the measurement.

(External Quantum Efficiency)

Electric current of 2.5 mA/cm² was supplied to each organic EL element at 23° C. in a dry nitrogen atmosphere, and the external quantum efficiency (%) of each sample was measured. The external quantum efficiency (%) was calculated from the date obtained by using a spectroradiometer CS-1000 produced by Minolta Inc.

In Table 2, the emission lives of Organic EL Elements 1-1 and 1-2 were expressed by relative values when the emission life of Organic EL Element 1-2 was set to 100; the emission lives of Organic EL Elements 1-3 to 1-5 were expressed by relative values when the emission life of Organic EL Element 1-5 was set to 100; the emission lives of Organic EL Elements 1-6 to 1-8 were expressed by relative values when the emission life of Organic EL Element 1-8 was set to 100; and the emission lives of Organic EL Elements 1-9 and 1-10 were expressed by relative values when the emission life of Organic EL Element 1-10 was set to 100.

TABLE 2

| Organic EL Element | Emission Life (Relative Value %) | Remarks | External Quantum Yield (Relative Value %) |
| --- | --- | --- | --- |
| 1-1 | 1100 | Inventive | 110 |
| 1-2 | 100 | Comparative | 100 |
| 1-3 | 1500 | Inventive | 117 |
| 1-4 | 2000 | Inventive | 120 |
| 1-5 | 100 | Comparative | 100 |
| 1-6 | 1000 | Inventive | 115 |
| 1-7 | 900 | Inventive | 110 |
| 1-8 | 100 | Comparative | 100 |
| 1-9 | 105 | Comparative | 102 |
| 1-10 | 100 | Comparative | 100 |

The results shown in Table 2 revealed that the organic EL elements of the present invention exhibited longer emission lives.

Example 2

Preparation of Full Color Displays (Organic EL Element Emitting Blue Light)

Organic EL Element 1-4 prepared in Example 1 was used.

(Organic EL Element Emitting Green Light)

Organic EL Element 1-1 prepared in Example 1 was used.

(Organic EL Element Emitting Red Light)

Organic EL Element 1-4R, prepared in the same manner as Organic EL Element 1-4 except that Ir-9 was used instead of I-12, was used.

The above blue, green and red light emitting organic EL elements were juxtaposed on the same substrate to prepare a full color display driven by an active matrix method, illustrated in FIG. 1. In FIG. 2, a schematic drawing of only display section A is shown. Namely, on the same substrate, a wiring section containing plural scanning lines 5 and plural data lines 6 and juxtaposed plural pixels 3 (pixels emitting red light, pixels emitting green light and pixels emitting blue light) are provided. The plural scanning lines 5 and plural data lines 6 of the wiring section are composed of an electroconductive material. The lines 5 and the lines 6 are crossing with each other at a right angle to form a lattice, and connected to the pixels 3 at the crossed points (not illustrated). The plural pixels 3 are driven by an active matrix method in which each pixel contains an organic EL element emitting a corresponding color light and active elements including a switching transistor and a driving transistor. When scanning signals are applied through the scanning lines 5, image data signals are received through data lines 6, and emission occurs according to the received image data. By juxtaposing red light emitting pixels, green light emitting pixels, and blue light emitting pixels side by side on the same substrate, display of a full color image was fabricated.

By driving the full color display, it was confirmed that a full color moving picture with long life was obtained.

Example 3

Figure 5:
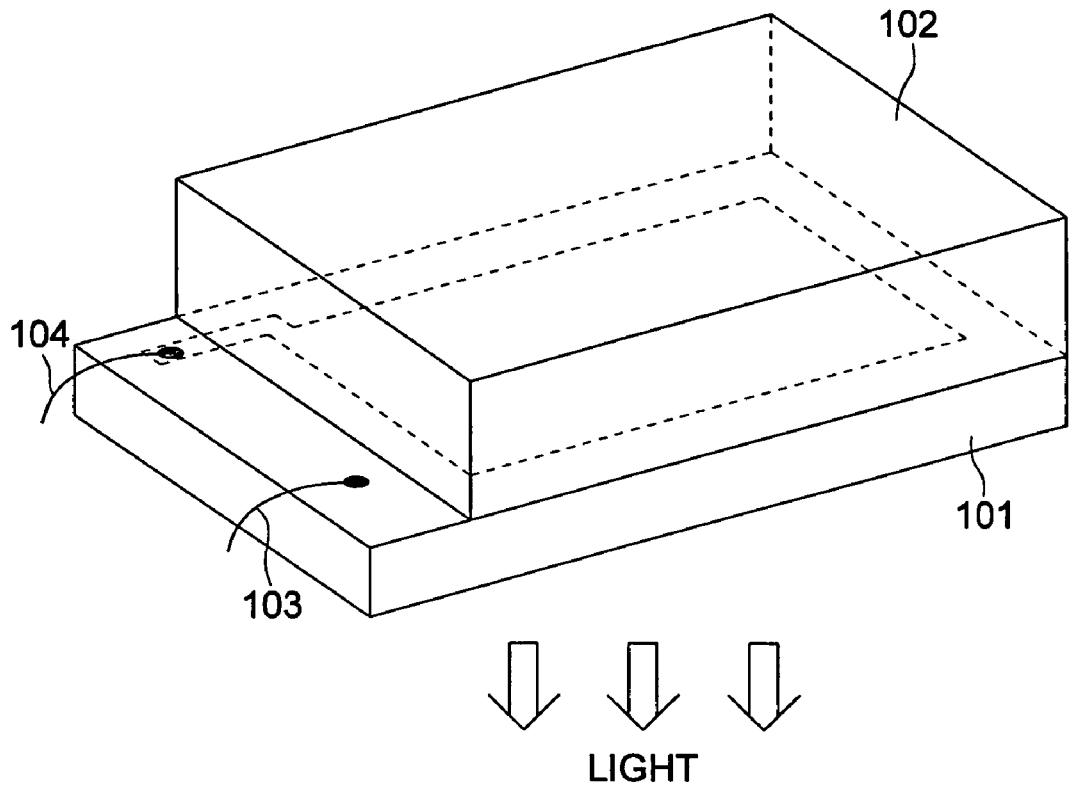
FIG. 5 is a schematic drawing of an illumination.
Figure 6:
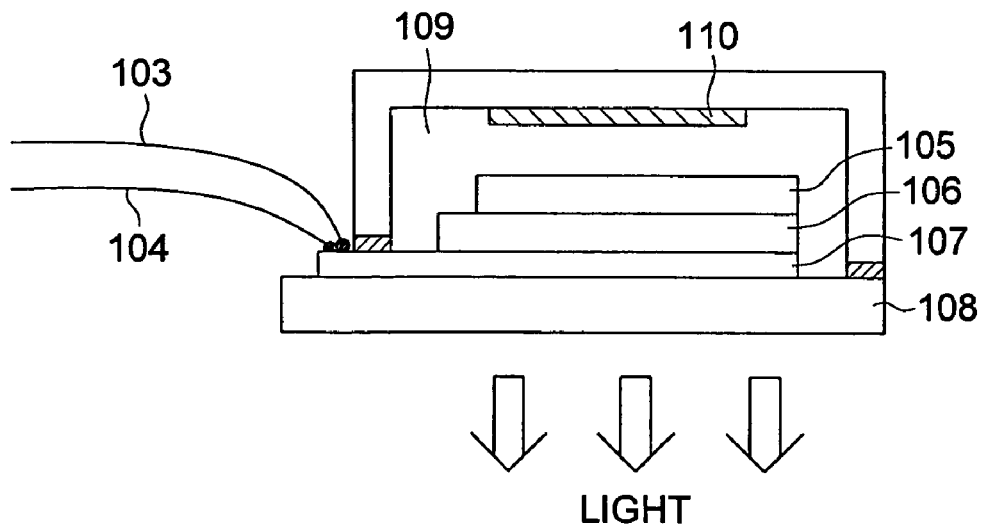
FIG. 6 is a cross sectional view of an illumination.

An illuminator was prepared by covering the non-emitting surface of Organic EL Element 1-6 with a glass case. Thus prepared illuminator was found to be a thin film white light emitting illuminator exhibiting high luminance, high emission efficiency and long life. FIG. 5 shows a schematic illustration of the illuminator, and FIG. 6 shows a cross-section of the illuminator.

POSSIBILITY FOR INDUSTRIAL USE

The present invention enables to provide an organic electroluminescent element, an illuminator and a display, exhibiting long life.

The invention claimed is:

1. An organic electroluminescent element comprising an anode and a cathode having therebetween a light emitting layer containing a phosphorescent compound, and a hole blocking layer provided adjacent to the light emitting layer and between the light emitting layer and the cathode, wherein
    the hole blocking layer contains a phosphorescent compound; and
    a content of the phosphorescent compound contained in the hole blocking layer, in percent by weight, is in the range of 0.1 to 20% of a content, in % by weight, of the phosphorescent compound contained in the light emitting layer.

2. The organic electroluminescent element of claim 1, wherein the organic electroluminescent element further comprises a second hole blocking layer provided adjacent to the hole blocking layer and between the hole blocking layer and the cathode.

3. The organic electroluminescent element of claim 1, wherein the phosphorescent compound contained in the light emitting layer is the same as the phosphorescent compound contained in the hole blocking layer.

4. The organic electroluminescent element of claim 1, wherein the phosphorescent compound contained in the light emitting layer is different from the phosphorescent compound contained in the hole blocking layer.

5. An organic electroluminescent element comprising an anode and a cathode having therebetween a light emitting layer containing a phosphorescent compound, and an electron blocking layer provided adjacent to the light emitting layer and between the light emitting layer and the anode, wherein the electron blocking layer contains a phosphorescent compound; and a content, in % by weight, of the phosphorescent compound contained in the electron blocking layer is in the range of 0.1 to 20% of the content, in % by weight, of the phosphorescent compound contained in the light emitting layer.

6. The organic electroluminescent element of claim 5, wherein the organic electroluminescent element further comprises a second electron blocking layer provided adjacent to the electron blocking layer and between the electron blocking layer and the anode.

7. The organic electroluminescent element of claim 5, wherein the phosphorescent compound contained in the light emitting layer is the same as the phosphorescent compound contained in the electron blocking layer.

8. The organic electroluminescent element of claim 5, wherein the phosphorescent compound contained in the light emitting layer is different from the phosphorescent compound contained in the electron blocking layer.

9. An organic electroluminescent element comprising an anode and a cathode having therebetween a light emitting layer containing a phosphorescent compound; a hole blocking layer provided adjacent to the light emitting layer and between the light emitting layer and the cathode; and an electron blocking layer provided adjacent to the light emitting layer and between the light emitting layer and the anode, wherein the hole blocking layer contains a phosphorescent compound;

a content in % by weight of the phosphorescent compound contained in the hole blocking layer is in the range of 0.1 to 20% of the content, in % by weight, of the phosphorescent compound contained in the light emitting layer;

the electron blocking layer contains a phosphorescent compound; and the content, in % by weight, of the phosphorescent compound contained in the electron blocking layer is in the range of 0.1 to 20% of the content, in % by weight, of the phosphorescent compound contained in the light emitting layer.

10. The organic electroluminescent element of claim 9, wherein the organic electroluminescent element further comprises a hole blocking layer provided adjacent to the hole blocking layer and between the hole blocking layer and the cathode.

11. The organic electroluminescent element of claim 9, wherein the organic electroluminescent element further comprises a second electron blocking layer provided adjacent to electron blocking layer and between the electron blocking layer and the anode.

12. The organic electroluminescent element of claim 9, wherein the phosphorescent compound contained in the light emitting layer is the same as the phosphorescent compound contained in the hole blocking layer.

13. The organic electroluminescent element of claim 9, wherein the phosphorescent compound contained in the light emitting layer is different from the phosphorescent compound contained in the hole blocking layer.

14. The organic electroluminescent element of claim 9, wherein the phosphorescent compound contained in the light emitting layer is the same as the phosphorescent compound contained in the electron blocking layer.

15. The organic electroluminescent element of claim 9, wherein the phosphorescent compound contained in the light emitting layer is different from the phosphorescent compound contained in the electron blocking layer.

16. The organic electroluminescent element of claim 1 emitting white light.

17. A display comprising the organic electroluminescent element of claim 1.

18. An illumination device comprising the organic electroluminescent element of claim 1.

19. A display comprising a liquid crystal cell and the illumination device of claim 18.

20. The organic electroluminescent element of claim 5 emitting white light.

21. A display comprising the organic electroluminescent element of claim 5.

22. An illumination device comprising the organic electroluminescent element of claim 5.

23. A display comprising a liquid crystal cell and the illumination device of claim 22.

24. The organic electroluminescent element of claim 9 emitting white light.

25. A display comprising the organic electroluminescent element of claim 9.

26. An illumination device comprising the organic electroluminescent element of claim 9.

27. A display comprising a liquid crystal cell and the illumination device of claim 26.

* * * * *